(12) United States Patent
Beneš et al.

(10) Patent No.: US 6,408,421 B1
(45) Date of Patent: Jun. 18, 2002

(54) HIGH-SPEED ASYNCHRONOUS DECODER CIRCUIT FOR VARIABLE-LENGTH CODED DATA

(75) Inventors: Martin Beneš, Arcadia, CA (US); Steven M. Nowick, Leonia, NJ (US); Andrew Wolfe, Los Gatos, CA (US)

(73) Assignees: The Trustees of Columbia University, New York, NY (US); The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/396,858

(22) Filed: Sep. 15, 1999

Related U.S. Application Data
(60) Provisional application No. 60/100,406, filed on Sep. 15, 1998.

(51) Int. Cl.$^7$ ............................................. G06F 11/10
(52) U.S. Cl. ........................................ 714/795; 714/791
(58) Field of Search ............................... 714/795, 755, 714/779, 791, 757; 382/427

(56) References Cited

U.S. PATENT DOCUMENTS
6,272,257 B1 * 8/2001 Prokop ........................ 382/246

OTHER PUBLICATIONS

S. Segars et al., Embedded Control Problems, Thumb, and the ARM7TDMI, *IEEE Micro*, (1995), pp. 22–30.

T. Williams et al., A Zero–Overhead Self–Timed 160–ns 54–b CMOS Divider, *IEEE Journal of Solid–State Circuits*, vol. 26, No. 11 (Nov. 1991), pp. 1651–1661.

S. Liao et al., Code Density Optimization for Embedded DSP Processors Using Data Compression Techniques, 16$^{th}$ Conference on Advanced Research in VL51 (Mar., 1995), (*IEEE Computer Society Press*), pp. 272–285.

L. Benini et al., Telescopic Units: Increasing the Average Throughput of Pipelined Designs by Adaptive Latency Control, Proceedings of IEEE Design Automation Conference (Jun. 1997), pp. 22–27.

M. Kozuch et al., Compression of Embedded System Programs, Proceedings of IEEE Int. Conference on Computer Design (Oct. 1994), pp. 270–277.

M. Matsui, et al., ISCC94/Session 4/Video and Communication Signal Processors/Paper WP 4.6: 200MHz Video Compression Macrocells Using Low–Swing Differential Logic, IEEE International Solid–State Circuits Conference (1994), pp. 76–77.

M. Karlsson et al., New Approaches to High Speed Huffman Decoding, IEEE ISCAS–96 Conference (1996), pp. 149–152.

S. Choi et al., High Speed Pattern Matching For A Fast Huffman Decoder, *IEEE Transactions on Consumer Electronics* 41(1): pp. 97–103 (Feb. 1995).

(List continued on next page.)

*Primary Examiner*—Phung M. Chung
(74) *Attorney, Agent, or Firm*—Baker Botts L.L.P.

(57) ABSTRACT

There is disclosed a decoder circuit that includes a logic circuit for decoding variable-length coded data coupled to a timing circuit. The logic circuit includes a plurality of computational logic stages, each of the computational logic stages having a synchronization signal input and a completion signal output. Each completion signal output indicates the completion of the computation performed by a computational logic stage. The timing circuit includes a plurality of completion signal inputs and a synchronization signal output, the synchronization signal output being a predetermined function of the completion signal inputs. The completion signal inputs are coupled to the completion signal outputs of the computational logic stages, and the synchronization output is coupled to the synchronization signal inputs of the computational logic stages.

13 Claims, 34 Drawing Sheets

OTHER PUBLICATIONS

N. Ishiura et al., Instruction Code Compression for Application Specific WLIW Processors Based on Automatic Field Partitioning, Pcgs. of the Workshop on Synthesis and System Integration of Mixed Technologies (SASIMI '97), pp. 105–109; Osaka, Japan (Dec. 1997).

B. Wei et al. A Parallel Decoder of Programmable Huffman Codes, *IEEE Transactions on Circuits and Systems for Video Technology*, vol. 5, No. 2, pp. 175–177 (Apr. 1995).

H. Park et al., Area Efficient Fast Huffman Decoder for Multimedia Applications, *IEEE ICASSP*, pp. 3279–3281 (1995).

Takao et al., HDTV Level MPEG2 Video Decoder VLSI, *IEEE Dept. Info. Systems Eng.*, Osaka University, pp. 468–471 (1995).

M. Matsui, ISSCC94/Session 4/Video and Communication Signal Processors/Paper WP 4.6: 200MHz Video Compression Macrocells Using Low–Swing Differential Logic, IEEE International Solid–State Circuits Conference, pp. 76–77 (1994).

R. Hashemian, et al., Design and Hardware Implementation of a Memory Efficient Huffman Decoding, *IEEE Transactions on Consumer Electronics*, International Conference on Consumer Electronics, vol. 40, No. 3 ITCEDA (ISSN 0098–3063), pp. 345–351, (Aug. 1994).

Y. Yoshida, An Object Code Compression Approach to Embedded Processors, IEEE Int. Symposium On Low–Power Electronics and Design, pp. 265–268 (Aug. 1999).

* cited by examiner-

HIGH-SPEED ASYNCHRONOUS DECODER CIRCUIT FOR VARIABLE-LENGTH CODED DATA

CROSS-REFERENCE TO RELATED APPLICATIONS

This application claims the benefit of U.S. Provisional Application No. 06/100,406, filed on Sep. 15, 1998, which is incorporated herein by reference in its entirety.

NOTICE OF GOVERNMENT RIGHTS

The U.S. Government has certain rights in this invention pursuant to the terms of National Science Foundation Award MIP-9408462 and National Science Foundation Award MIP-9501880.

BACKGROUND OF THE INVENTION

This invention relates to an asynchronous decoder circuit. More specifically, this invention relates to an asynchronous decoder circuit that operates on data coded using a variable-length coding technique, such as Huffman coding.

Huffman coding is a lossless coding technique that replaces fixed-length symbols with variable-length codes. Huffman codes are entropy-based, meaning that short codes are assigned to frequently occurring symbols and longer codes are assigned to less frequently occurring symbols. In addition, Huffman codes are prefix codes, meaning that each code has the property that appending additional bits to the end of the code never produces another valid code. Advantageously, Huffman coding has been used for the compression of data.

In applications utilizing Huffman-coded data, the size and speed of a Huffman decoder are important. For example, small and fast Huffman decoders are necessary in compressed-code systems and MPEG-2 video systems. A compressed-code system is a microprocessor or microcontroller-based system in which instructions are stored in compressed form in memory, then are decompressed when brought into a cache. As a result, a significant reduction in instruction memory size may be obtained. The design of a decompression circuit for these systems is highly constrained. In particular, the circuit must be very fast (since it is on the critical path between the processor and memory) and must also be very small (otherwise the savings in instruction memory will be lost to the area increase due to the decompression circuit). MPEG-2 is an international image coding standard promulgated by the International Standardization Organization (ISO), which requires data to be decoded at a rate of 100 Mbits/sec or greater to maintain a sufficient quality of audio and video output.

To date, there have been two commonly used approaches to the design of Huffman decoders, which have been commonly referred to as the constant-input-rate approach and the constant-output-rate approach. Both of these approaches are a synchronous—i.e., the decoders are synchronized to an external system clock.

In the constant-input-rate approach, the input data stream is processed at a rate of one bit per clock cycle by traversing a Huffman code tree through the use of a finite state machine. To achieve a high performance using this type of design requires a very fast clock, introducing many very difficult high-speed circuit problems. In fact, it is unlikely that a state machine of adequate complexity can be designed to run at the speeds required by the constant-input-rate approach on a silicon wafer produced by certain semiconductor processes, such as those using $0.8\mu$ or thicker CMOS wafers. To avoid the problems caused by the use of very high-speed clocks, multiple state transitions may be combined into a single cycle. As multiple state transitions are combined, however, the complexity and circuit area of the decoder increase approximately exponentially with respect to the increased performance per clock cycle.

In the constant-output-rate approach, a portion of the input data stream, at least as long as the longest input symbol, is translated into an output symbol on each clock cycle. One disadvantage to this approach is that it requires more complex shifting and symbol detection circuitry than the constant-input-rate approach. Furthermore, the input data buffer and shifting circuitry must be wide enough to store and shift the longest of the input symbols, which is inefficient since the most frequently occurring input symbols will be shorter than the longest input symbol. Another significant disadvantage of the constant-output-rate approach is that the length of the critical path is dominated by the time to detect and decode the longest input symbol. Thus, the vast majority of cycles are limited by a very infrequent worst-case path.

In sum, each of the two commonly-used approaches to the design of Huffman decoders requires a compromise between the performance and the complexity (circuit area) of the implementations. Accordingly, there exists a need for an improved Huffman decoder design that provides higher performance per circuit area than is possible with existing circuit designs.

SUMMARY OF THE INVENTION

The present invention solves the foregoing problems by employing an innovative asynchronous design, which produces a decoder that is significantly smaller than comparable synchronous decoders, and yet has a higher throughput rate than these decoders after normalizing for voltage and process differences between the decoders.

According to the present invention, there is provided a decoder circuit, which includes a logic circuit for decoding variable-length coded data and a timing circuit. The logic circuit includes a plurality of computational logic stages, each of the computational logic stages having a synchronization signal input and a completion signal output. Each completion signal output indicates the completion of the computation performed by a computational logic stage. The timing circuit includes a plurality of completion signal inputs, which are coupled to the completion signal outputs of the computational logic stages, and a synchronization signal output, which is coupled to the synchronization signal inputs of the computational logic stages. The synchronization signal output of the timing circuit is not a periodic signal with a fixed cycle period. Instead, the synchronization signal is an asynchronous output determined as a function of the completion signal inputs.

In a preferred embodiment of the present invention, the decoder operates on data that has been coded according to a variable-length coding technique in which coded data words are classified according to their word length and the occurrence of common bits therein. The common bits are unique relative to at least a subset of the classes of the coded data words. In such an embodiment, the logic circuit of the decoder includes: an alignment circuit for shifting an input data word by an amount responsive to a control input and for outputting the shifted data word; a match logic circuit coupled to the output of the alignment circuit for decoding the class of a coded data word included in the shifted data word; a decode logic circuit coupled to the output of the alignment circuit for decoding the coded data word included in the shifted data word; a length logic circuit coupled to the output of the match logic circuit for determining the length of the coded data word included in the shifted data word; an offset register having a register data input and a register data output, the register data output coupled to the control input of the alignment circuit; and an adder circuit for adding first and second adder inputs, the first adder input coupled to the output of the length logic circuit and the second adder input coupled to the register data output, the output of the adder circuit coupled to the register data input.

The decoder circuit is preferably designed such that the alignment circuit, the match logic circuit, and the adder circuit comprise a computational logic stage, and the alignment circuit, the match logic circuit, and the decode logic circuit comprise another computational logic stage.

The adder circuit may include a carry output indicative of a carry resulting from the addition of the first and second adder inputs, and the logic circuit may further include an input buffer having a plurality of registers. The registers may be coupled together in series, and the data output of one or more of the registers may be coupled to the data input of the alignment circuit.

The logic circuit may further include a shift sequence circuit coupled to the carry output of the adder circuit and to the clock inputs of the input registers for shifting the input registers responsive to the carry output of the adder circuit.

The decoder circuit may further include input and output handshaking circuits for implementing an asynchronous handshake between the decoder circuit and external circuits coupled to the decoder circuit.

BRIEF DESCRIPTION OF THE DRAWINGS

Exemplary embodiments of the present invention will now be described in detail with reference in the accompanying drawings in which.

Throughout the figures of the drawings, the same reference numerals or characters are used to denote like components or features of the invention.

DETAILED DESCRIPTION

Figure 1A:
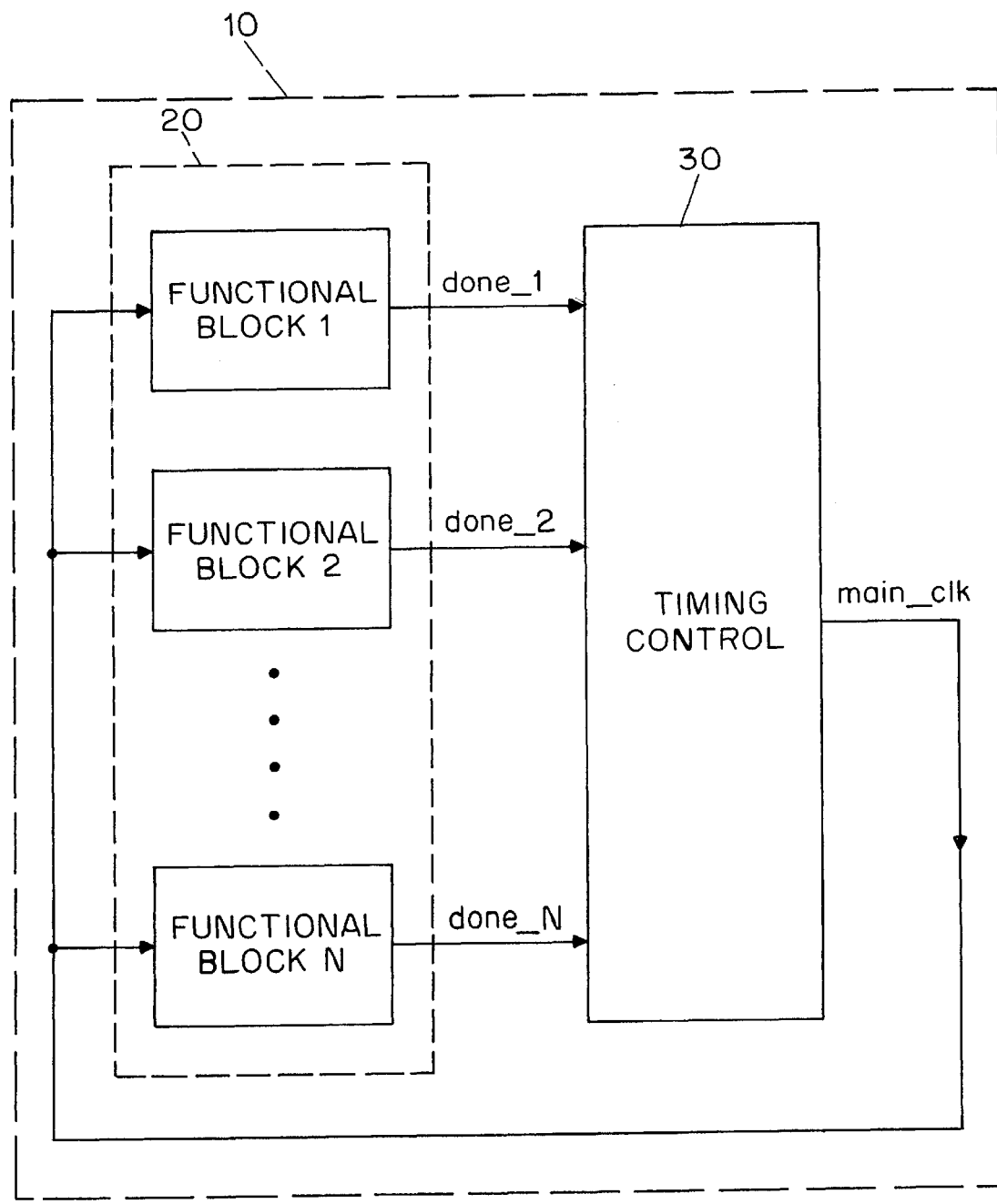
FIG. 1A is a functional block diagram of a decoder according to a preferred embodiment of the present invention.

FIG. 1A is a functional block diagram of a decoder according to the present invention. The decoder 10 includes a logic circuit 20 coupled to a timing control circuit 30. The logic circuit 20 decodes data words encoded using a variable-length coding technique, such as Huffman coding. The logic circuit 20 includes a plurality of functional blocks (represented in FIG. 1A as functional blocks 1 to N). The functional blocks have completion signal outputs, done__1, done__2, . . . done__N, which indicate the completion of the computation performed by the functional blocks.

The timing circuit 30 generates a synchronization signal main__clk for synchronizing the operation of the functional blocks of FIG. 1A. Advantageously, unlike prior synchronous designs, the synchronization signal main__clk is not derived from an external or internal periodic clock signal. Instead, the transitions of the synchronization signal main__clk are based on the completion signals from one or more of the functional blocks. Thus, although the decoder of FIG. 1A decodes one code word per cycle of the synchronization signal main__clk, the length of that cycle varies depending on the time it takes to decode a particular code word.

Figure 1B:
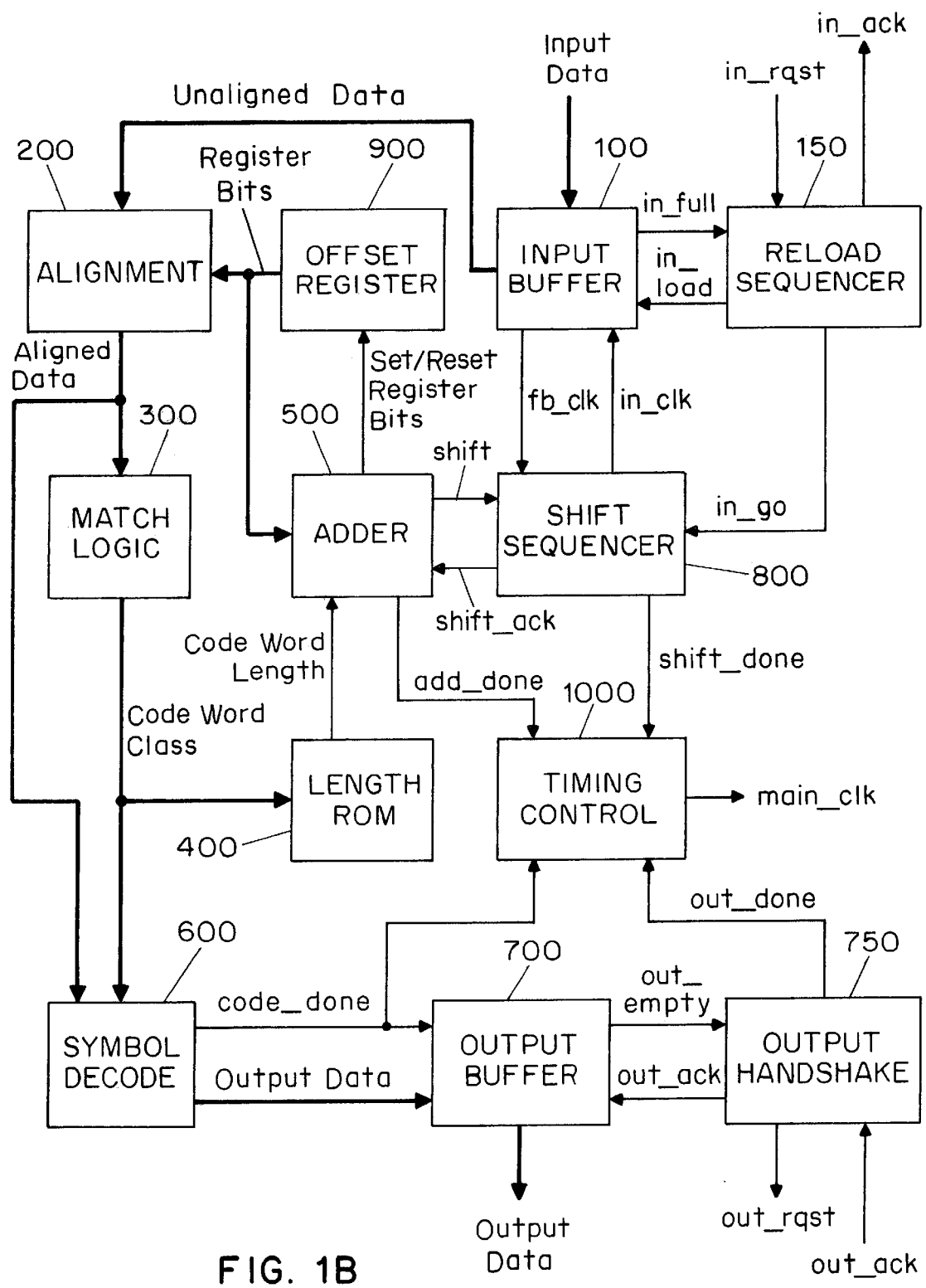
FIG. 1B is a functional block diagram of a decoder according to another preferred embodiment of the present invention.

FIG. 1B is a functional block diagram of a decoder according to a preferred embodiment of the present invention. The decoder of FIG. 1B includes an input buffer 100, which receives and stores input data that has been coded using a variable-length coding technique, such as Huffman coding. Coded data is input into the input buffer 100 in fixed-length words (for example, 32-bit words).

Figure 2:
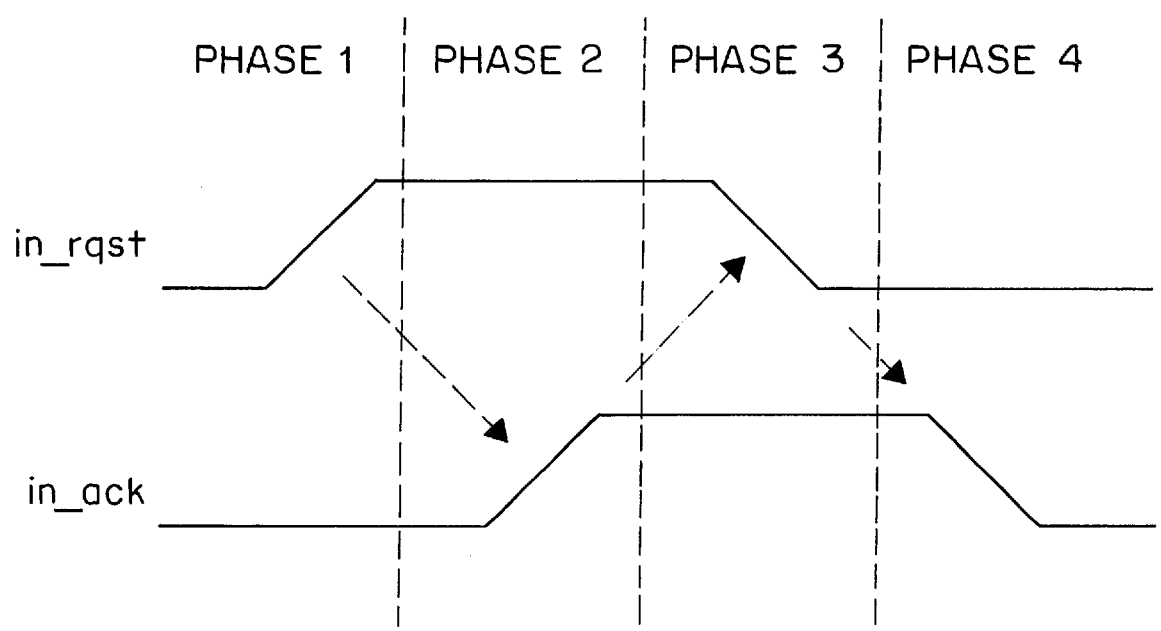
FIG. 2 is an exemplary timing diagram for an asynchronous, four-phase handshaking protocol that may be used with a decoder according to the embodiment of FIG. 1B.

Input data is input into the input buffer 100 under the control of a reload sequencer circuit 150. The reload sequencer circuit 150 preferably implements an asynchronous handshake with the circuit providing the input data, such as the asynchronous, four-phase handshake shown in FIG. 2. As shown in FIG. 2, in the first phase of the handshake, the handshake is initiated by the assertion (the low-to-high transition) of the request signal in__rqst by the circuit providing the input data, which indicates that the input data is valid. In the second phase of the handshake, after the request signal in__rqst is asserted, the input data is read into the input buffer 100. Once the input data has been read into the input buffer, the acknowledge signal in__ack is asserted (by low-to-high transition) by the reload sequencer circuit 150. In the third phase, in response to the assertion of the acknowledge signal in__, the request signal in__rqst is released (high-to-low transition), indicating the input data is no longer valid. Finally, in the fourth phase, after the request signal in__rqst is released, the acknowledge signal in__ack is also released after the input buffer 100 is ready to receive more data.

Returning to FIG. 1B, because the coded data in the input buffer 100 contains variable-length code words, the beginning of a code word may not always be aligned with the first bit of the input buffer. (In fact, it usually will not be.) Accordingly, the unaligned data from the input buffer 100 is coupled to an alignment circuit 200, which is capable of shifting the input data by the number of bits indicated by an offset register 900.

The decoder of FIG. 1B preferably operates on data that is coded according to a variable-length coding technique in which coded data words may be classified according to their word length and the occurrence of common bits therein. The common bits are unique relative to at least a subset of the classes of the coded data words. When data is coded in this way, the decoding process is preferably performed in two stages. The first stage of the decoding process is performed by a match logic circuit 300, and the second stage of the decoding process is performed by a symbol decode circuit 600.

The aligned data from the alignment circuit 200 is coupled to both the match logic circuit 300 and the symbol decode circuit 600. By examining the aligned data from the alignment circuit 200 for the common bits of each class, the match logic circuit 300 determines the class of a code word. Using the code word class from the match logic circuit 300 and the enumerating bits of the aligned data from the alignment circuit 200 (as will be explained below), the symbol decode circuit 600 determines the symbol corresponding to a code word. This symbol is transmitted to an output buffer 700, which stores one or more symbols for transmission in an appropriate-length word. For example, if the symbols are eight bits in length, and the output word is 32 bits in length, the output buffer 700 will store four symbols before transmitting an output word.

The output buffer 700 communicates with an output handshake circuit 750, which implements an asynchronous handshake with the circuit receiving the output data. The output handshake may be the same asynchronous, four-phase handshake discussed previously with regard to the reload sequencer circuit 150.

At the same time as the symbol decode circuit 600 performs its computation, a length read-only memory (ROM) 400 concurrently determines the length of a code word associated with the code word class provided by the match logic circuit 300. An adder circuit 500 then sums the code word length from the length ROM 400 and the offset value in the offset register 900. The sum produced by the adder circuit 500 determines a new offset value, which is stored in the offset register 900 and which indicates the offset of the next code word contained in the input buffer 100.

Preferably, to reduce the hardware of the alignment circuit 200, the input buffer 100 includes a plurality of registers connected together sequentially through which the input data may be shifted. These registers are preferably controlled by a shift sequencer circuit 800. The shift sequencer circuit 800 is coupled to the input buffer 100, the adder circuit 500, and the reload sequencer circuit 150.

The decoder of FIG. 1B also includes a timing control circuit 1000, which generates the synchronization signal main__clk for synchronizing the operation of the functional blocks of FIG. 1B. As discussed previously, the synchronization signal main__clk is not derived from an external or internal periodic clock signal. Instead, the transitions of the synchronization signal main__clk are based on completion signals from one or more of the functional blocks of FIG. 1B. For example, as shown in FIG. 1B, the transitions of the synchronization signal main__clk may be based on the completion signals add_done, code_done, shift_done, and out_done from the adder circuit 500, the symbol decode circuit 600, the shift sequencer circuit 800, and the output handshake circuit 750, respectively. Advantageously, the length of a decode cycle is not fixed, but instead varies depending on the time it takes to decode a particular code word.

Preferably, for improved efficiency, some of the functional blocks of FIG. 1B may be implemented with dynamic (or precharged) domino logic. When the functional blocks are implemented in this way, the operation of the decoder may be divided into two stages: an evaluation stage (during which the dynamic domino logic blocks evaluate their inputs) and a precharge stage (during which the dynamic domino logic blocks precharge). These two stages are advantageously controlled by the state of the synchronization signal main_clk. For example, the evaluation stage may be associated with the logic low cycle of the synchronization signal main_clk, and the precharge stage may be associated with the logic high cycle of the synchronization signal main_clk.

In a preferred embodiment of the present invention, the alignment circuit 200, match logic circuit 300, length ROM 400, adder 500, and symbol decode circuit 600 are implemented in dynamic domino logic. Therefore, during the evaluation stage these functional blocks evaluate their inputs, and during the precharge stage these functional blocks precharge. Concurrently, while these functional blocks precharge, other blocks may perform operations. For example, it is preferred that the shift sequencer circuit 800 performs any necessary shifting of the registers of the input buffer 100 during the precharge stage. The concurrent precharging of the dynamic domino logic blocks and the operation of other functional blocks enhances the performance of the decoder of FIG. 1B.

For the purpose of illustrating the preferred two-stage decoding process of the present invention, Table 1 shows an example of Huffman coding for the MIPS processor instruction set. The codes used are based on measurements of the frequency of instructions from a sample set of programs for the MIPS architecture. The Huffman codes shown in Table 1 range in length from two bits to fourteen bits for each instruction.

The length of each Huffman code in Table 1 is precisely determined by the frequency distribution of the instructions for the MIPS architecture. Nonetheless, the actual bit encoding for each instruction is flexible, as long as the prefix property and the code length requirements of Huffman codes are maintained. The preferred approach, therefore, is to select code words of a given length such that those code words contain as many common bits as possible, which are unique to that group of code words. To simplify the encoding process, the common bits need not be unique to all classes. Instead, an order of decoding may be assigned to the classes and the common bits for a class may be unique relative to the subset of classes occurring later in the decoding order.

For example, note that all of the five-bit long Huffman codes shown in Table 1 contain the string "010" as the initial three bits, while no other code words contain those values in those positions. This allows use of that substring in that position to define a class of 5-bit code words and allows use of the remaining bits to enumerate the members of that class. In many cases, the coding can be structured such that only a small number of bits are required to be tested in order to determine the length of the Huffman code.

Overall, for the coding shown in Table 1, the 256 different code words are grouped into 31 distinct classes. This grouping of classes is shown in Table 2, along with the common bit patterns for each class and the enumerating bits used to distinguish the class members. The decoding process begins at the top of the table with class 0 and proceeds downward, class by class, until a match is found. In Table 2, a dash ("–") represents a "don't care" and a period represents an enumerating bit.

TABLE 1

Example of Huffman Coding for MIPS Architecture

| | | | | | | | | | | | |
|---|---|---|---|---|---|---|---|---|---|---|---|
| 00 | 00 | 2c | 10111001 | 86 | 110111000 | b6 | 1110111110 | fd | 11111001010 | fa | 111111100000 |
| 8f | 01000 | b0 | 10111010 | 43 | 110111001 | fe | 1110111111 | 7e | 11111001011 | f5 | 111111100001 |
| 24 | 01001 | 09 | 10111011 | b9 | 110111010 | e2 | 1111000000 | 65 | 11111001100 | 56 | 111111100010 |
| 01 | 01010 | f8 | 10111100 | 8a | 110111011 | e6 | 1111000001 | 67 | 11111001101 | d2 | 111111100011 |
| 10 | 01011 | e7 | 10111101 | 6c | 110111100 | ef | 1111000010 | f7 | 11111001110 | cd | 111111100100 |
| 46 | 011000 | a8 | 10111110 | 32 | 110111101 | d4 | 1111000011 | 71 | 11111001111 | f6 | 111111100101 |
| 25 | 011001 | ac | 10111111 | a9 | 110111110 | ce | 1111000100 | 3a | 11111010000 | ed | 111111100110 |
| 80 | 011010 | 88 | 11000000 | 0b | 110111111 | 7f | 1111000101 | 9e | 11111010001 | 5e | 111111100111 |
| 08 | 011011 | 90 | 11000001 | 4c | 111000000 | 4b | 1111000110 | 7b | 11111010010 | 77 | 111111101000 |
| 03 | 011100 | e4 | 11000010 | aa | 111000001 | 4e | 1111000111 | 6b | 11111010011 | f2 | 111111101001 |
| 21 | 011101 | 50 | 11000011 | 13 | 111000010 | 39 | 1111001000 | 6a | 11111010100 | 97 | 111111101010 |
| 0c | 011110 | 2a | 11000100 | 64 | 111000011 | 2f | 1111001001 | c3 | 11111010101 | c9 | 111111101011 |
| 04 | 011111 | 44 | 11000101 | 0d | 111000100 | dc | 1111001010 | 1b | 11111010110 | 7d | 111111101100 |
| 20 | 100000 | bd | 11000110 | 68 | 111000101 | 45 | 1111001011 | 66 | 11111010111 | 55 | 111111101101 |
| ff | 100001 | 06 | 1100111 | 22 | 111000110 | 51 | 1111001100 | 35 | 11111011000 | ca | 111111101110 |
| 02 | 100010 | a5 | 11001000 | 2b | 111000111 | b3 | 1111001101 | 4d | 11111011001 | e9 | 111111101111 |
| af | 100011 | bf | 11001001 | a7 | 111001000 | 62 | 1111001110 | 79 | 11111011010 | 95 | 111111110000 |
| c0 | 1001000 | 1c | 11001010 | a3 | 111001001 | 9c | 1111001111 | 1e | 11111011011 | 9b | 111111110001 |
| 8c | 1001001 | 8d | 11001011 | 89 | 1110011010 | cf | 1111010000 | 3e | 11111011100 | 9f | 111111110010 |
| 8e | 1001010 | 38 | 11001100 | fc | 111001011 | 4f | 1111010001 | be | 11111011101 | fb | 111111110011 |
| 84 | 1001011 | 11 | 11001101 | ad | 111001100 | f4 | 1111010010 | 47 | 11111011110 | 69 | 111111110100 |
| 82 | 1001100 | 26 | 11001110 | c8 | 111001101 | 52 | 1111010011 | e1 | 11111011111 | 53 | 111111110101 |
| c0 | 1001101 | a4 | 11001111 | 23 | 111001110 | 91 | 1111010100 | 1f | 11111100000 | eb | 111111110110 |
| 28 | 1001110 | ac | 11010000 | 31 | 111001111 | 99 | 1111010101 | b7 | 11111100001 | 96 | 111111110111 |
| c4 | 1001111 | a0 | 11010001 | 87 | 111010000 | 5c | 1111010110 | 49 | 11111100010 | d7 | 1111111110000 |
| 30 | 1010000 | 05 | 11010010 | 81 | 111010001 | c5 | 1111010111 | 33 | 11111100011 | da | 1111111110001 |
| 18 | 1010001 | 60 | 11010011 | 15 | 111010010 | 17 | 1111011000 | 6f | 11111100100 | d3 | 1111111110010 |
| c7 | 1010010 | 2e | 110101000 | 58 | 111010011 | c1 | 1111011001 | 36 | 11111100101 | bb | 1111111110011 |
| 14 | 1010011 | ab | 110101001 | 98 | 111010100 | 7c | 1111011010 | e5 | 11111100110 | d5 | 1111111110100 |

TABLE 1-continued

Example of Huffman Coding for MIPS Architecture

| 40 | 1010100 | 63 | 110101010 | 0a | 111010101 | 61 | 1111011011 | 93 | 11111100111 | 9d | 1111111110101 |
|---|---|---|---|---|---|---|---|---|---|---|---|
| 27 | 1010101 | 29 | 110101011 | 0f | 111010110 | b5 | 1111011100 | f9 | 11111101000 | 5d | 1111111110110 |
| 3c | 1010110 | 92 | 110101100 | 83 | 111010111 | b2 | 1111011101 | 1a | 11111101001 | 9a | 1111111110111 |
| 12 | 10101110 | 8b | 110101101 | a2 | 111011000 | e8 | 1111011110 | ec | 11111101010 | 75 | 1111111111000 |
| 48 | 10101111 | d8 | 110101110 | a6 | 111011001 | 74 | 1111011111 | 76 | 111111010110 | 5f | 1111111111001 |
| 42 | 10110000 | b1 | 110101111 | 0e | 111011010 | ec | 1111100000 | de | 111111010111 | 7a | 1111111111010 |
| 41 | 10110001 | 94 | 110110000 | 73 | 1110110110 | 37 | 11111000010 | 3f | 111111011000 | 57 | 1111111111011 |
| 07 | 10110010 | d0 | 110110001 | 6c | 1110110111 | ca | 11111000011 | 5a | 111111011001 | ba | 1111111111100 |
| 85 | 10110011 | c6 | 110110010 | 2d | 1110111000 | d6 | 11111000100 | 5b | 111111011010 | 3b | 1111111111101 |
| 19 | 10110100 | a1 | 110110011 | c2 | 1110111001 | 72 | 11111000101 | f1 | 111111011011 | df | 1111111111110 |
| 78 | 10110101 | 16 | 110110100 | cc | 1110111010 | e3 | 11111000110 | d1 | 111111011100 | dd | 11111111111110 |
| 34 | 10110110 | b4 | 110110101 | 4a | 1110111011 | 1d | 11111000111 | f3 | 111111011101 | db | 11111111111111 |
| b8 | 10110111 | 54 | 110110110 | bc | 1110111100 | d9 | 11111001000 | cb | 111111011110 | | |
| 70 | 10111000 | f0 | 110110111 | 59 | 1110111101 | 6d | 11111001001 | 3d | 111111011111 | | |

TABLE 2

Class Match Logic

| Class | Matching Bit Pattern (b0...b13) | Length |
|---|---|---|
| 0 | 00............ | 2 |
| 1 | 0-0............ | 5 |
| 2 | 0--............ | 6 |
| 3 | -000............ | |
| 4 | -00-............ | 7 |
| 5 | -0-00............ | |
| 6 | -0-0-0............ | |
| 7 | -0-0--0............ | |
| 8 | -0-............ | 8 |
| 9 | --00............ | |
| 10 | --0-00............ | |
| 11 | --0-............ | 9 |
| 12 | ---00............ | |
| 13 | ---0-0............ | |
| 14 | ---0--00............ | |
| 15 | ---0--0-0 | |
| 16 | ---0--............ | 10 |
| 17 | ----0............ | |
| 18 | -----00000 | |
| 19 | -----0............ | 11 |
| 20 | ------00............ | |
| 21 | ------0-00. | |
| 22 | ------0-0-0 | |
| 23 | ------0-............ | 12 |
| 24 | -------0............ | |
| 25 | --------0............ | |
| 26 | ---------0............ | 13 |
| 27 | ----------0.. | |
| 28 | -----------0. | |
| 29 | ------------0 | |
| 30 | -------------. | 14 |

For the remainder of this specification, the preferred embodiment of the decoder of the present invention will be discussed with regard to the Huffman coding shown in Table 1 and the decoding order shown in Table 2. In addition, it will be assumed that data is input to and output from the decoder in 32-bit words. It will be understood, however, that the scope of the present invention is not limited to these cases.

Figure 3:
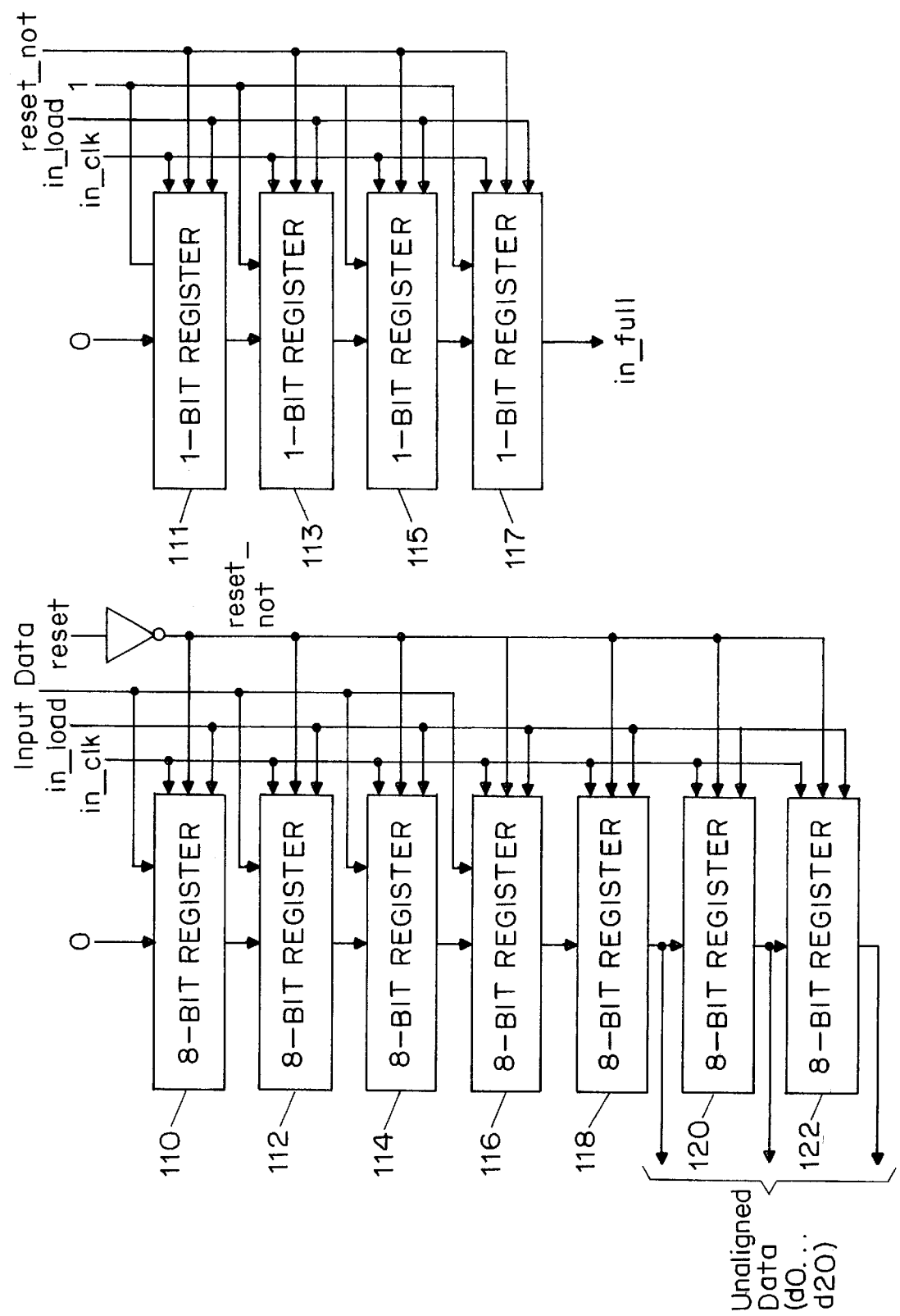
FIG. 3 is a functional block diagram of an input buffer of a decoder according to the embodiment of FIG. 1B.

FIG. 3 shows a functional block diagram of a preferred embodiment of the input buffer 100 of FIG. 1B. The input buffer is implemented as seven 8-bit registers connected in series. Four of the registers (registers 110, 112, 114, and 116) each receive a byte from the input data word. The registers are controlled by the signals in_clk and in_load. When in_clk is asserted high, all of the registers clock in the data byte from the preceding register—i.e., the data shifts to the right bytewise. For register 110, a value of zero is clocked in when in_clk is asserted high. When in_load is asserted high, the first four registers (registers 110, 112, 114, and 116) each load a byte of the input data word. Twenty-one bits of the last three registers (registers 118, 120, and 122) are coupled to the alignment circuit 200. Twenty-one bits are needed because the longest Huffman code is fourteen bits and the maximum offset of the start of a Huffman code in a register is seven bits.

The input buffer 100 also includes four one-bit status registers 111, 113, 115, and 117. These registers are controlled by in_clk and in_load in the same way as are registers 110, 112, 114, and 116 with the exception that, when in_load is asserted high, a value of "1" is loaded into each one-bit register. The output of the last one-bit register (register 117) is the in_full signal, which is used to indicate whether registers 110, 112, 114, and 116 hold valid data. When in_full goes low, these registers do not hold any valid data and the input buffer is considered empty. Of course, to be safely used as status bits, the one-bit registers should be designed so that they reflect the worst-case timing of every bit in the 8-bit registers. In addition, it is preferred that when reset is asserted high, all of the registers are cleared to zero.

Figure 4:
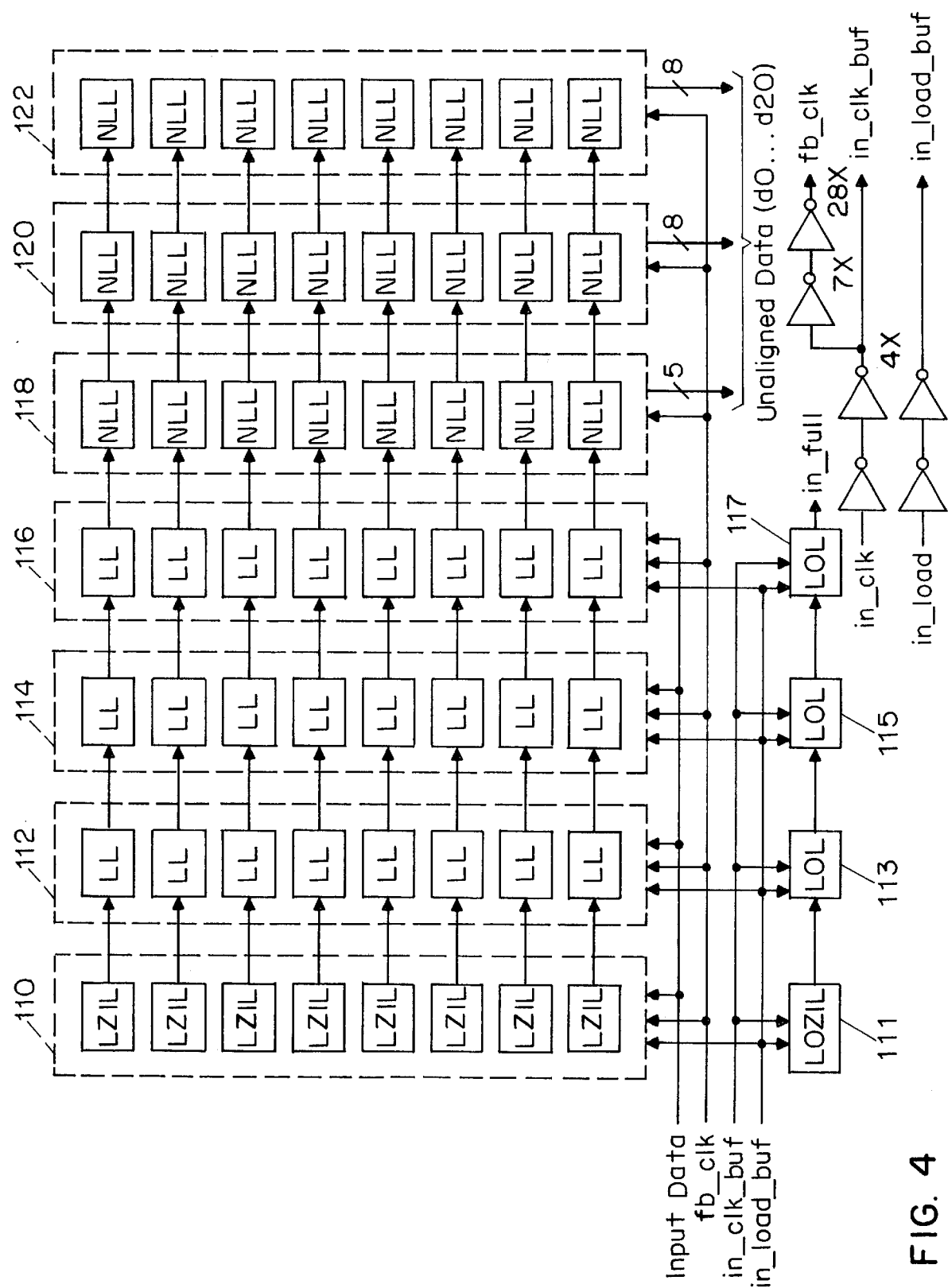
FIG. 4 is a functional block diagram of an input buffer according to the embodiment of FIG. 3.

FIG. 4 is a functional block diagram of a preferred embodiment of the registers of FIG. 3. The registers of the input buffer are implemented using five types of latches: (1) a "load-zero-input" (LZIL) latch; (2) a "load" (LL) latch; (3) a "no-load" (NLL) latch; (4) a "load-one-zero-input" (LOZIL) latch; and (5) a "load-one" (LOL) latch. Each of these types of latches is a variant of the Svensson latch and will be described in detail below.

As shown in FIG. 4, register 110 is implemented using eight LZIL latches; each of registers 112, 114, and 116 are implemented using eight LL latches; each of registers 118, 120, and 122 are implemented using eight NLL latches; register 111 is implemented using a LOZIL latch; and registers 113, 115, and 117 are implemented using three LOL latches.

Because of the high load on the in_clk and in_load signals, these signals should be properly buffered. Therefore, FIG. 4 shows multiple levels of inverter buffering for in_clk and in_load, producing the buffered signals in_clk_buf and fb_clk from in_clk and in_load_buf from in_load.

Figure 5:
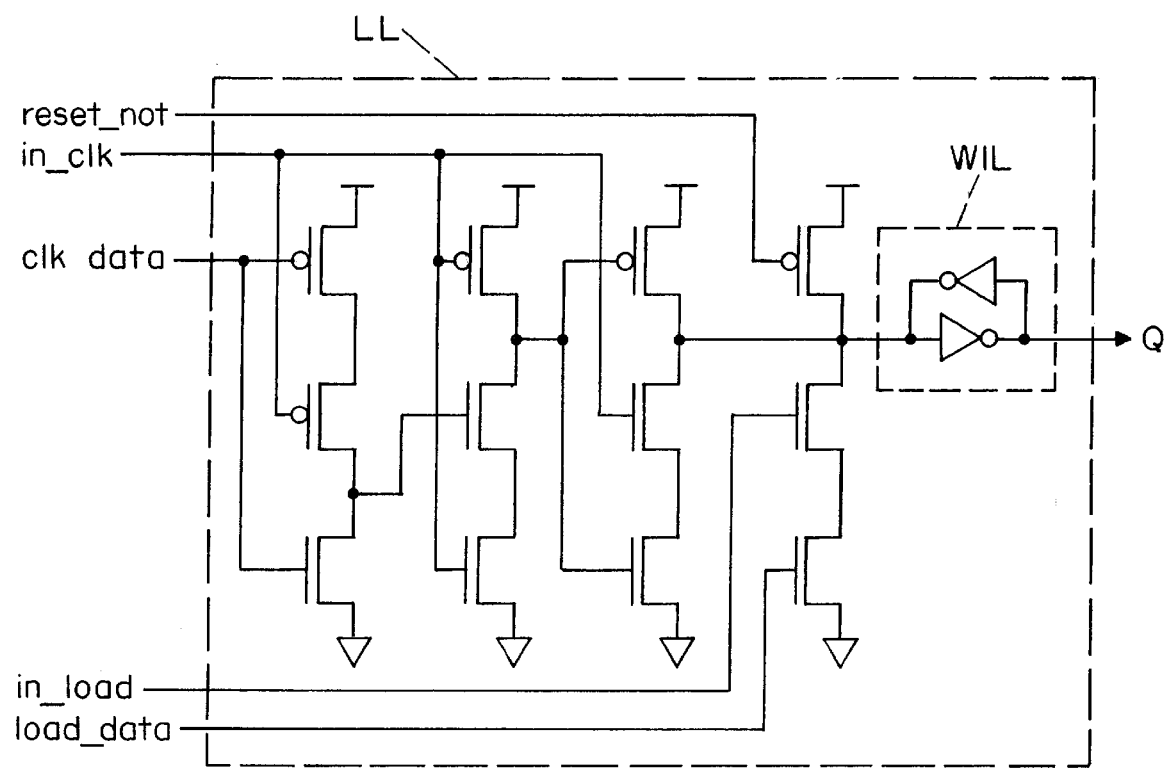
FIG. 5 is a schematic diagram of a latch of an input buffer according to the embodiment of FIG. 4.
Figure 5:
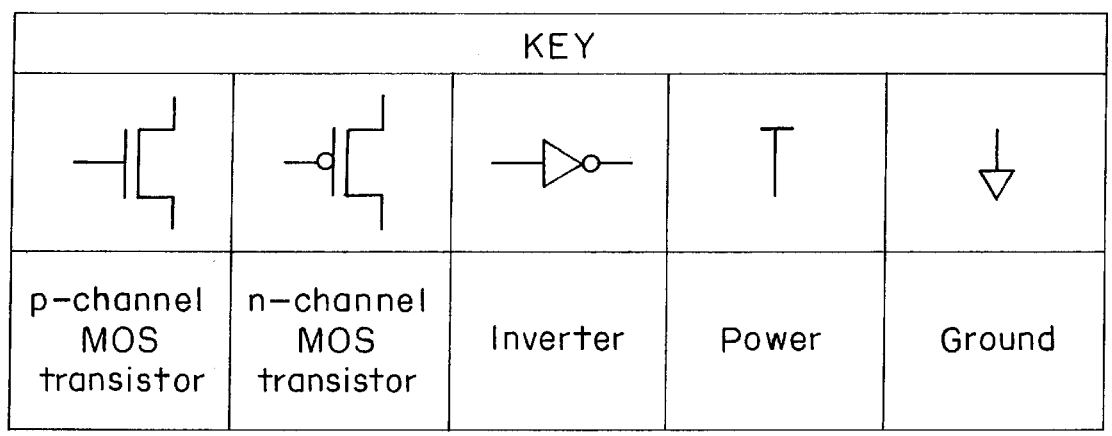

FIG. 5 shows a schematic diagram of a preferred embodiment of the LL latch. The latch is implemented using p-channel and n-channel MOS transistors with a weak inverter feedback loop (WIL) at the output stage. The key in FIG. 5 provides a reference for the symbols used in FIG. 5 and in other figures. In FIG. 5, the output Q takes on the value of the input clk_data when in_clk is asserted high and takes on the value of the input in_data when in_load is asserted high. The output Q is cleared to zero when reset_not is asserted low.

Figure 6:
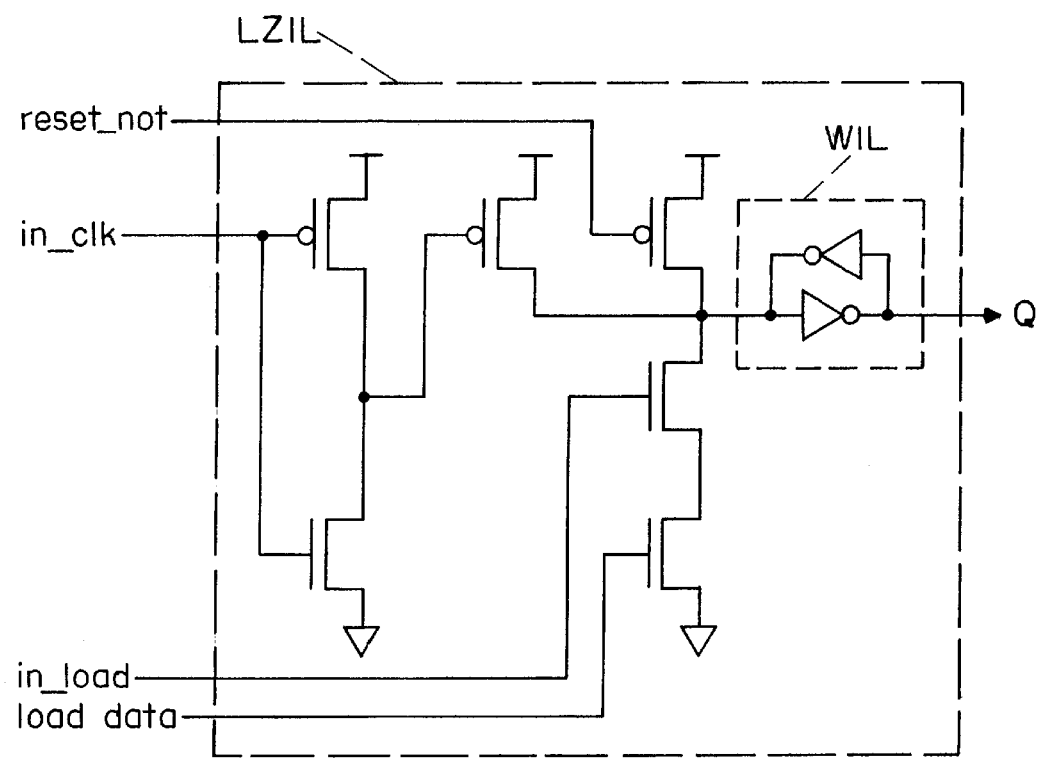
FIG. 6 is a schematic diagram of a latch of an input buffer according to the embodiment of FIG. 4.
Figure 7:
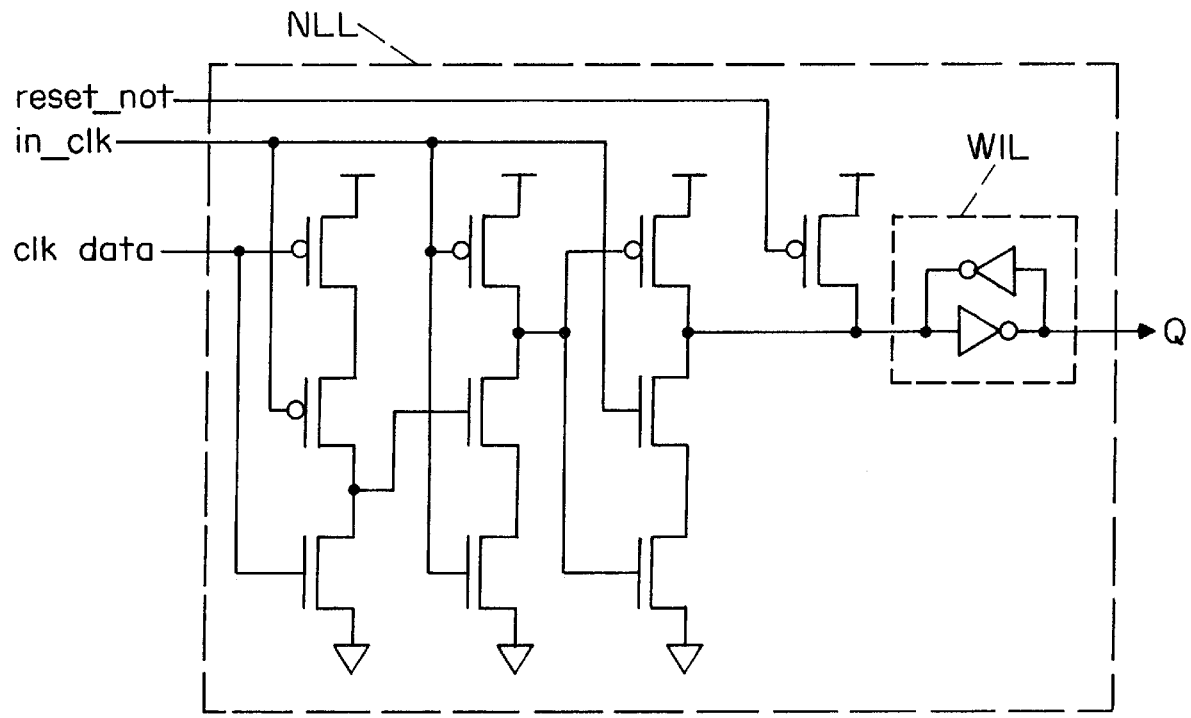
FIG. 7 is a schematic diagram of a latch of an input buffer according to the embodiment of FIG. 4.

FIGS. 6 and 7 are schematic diagrams of preferred embodiments of the LZIL and the NLL latches, respectively. These latches are simplified versions of the LL latch. The LZIL latch is similar to the LL latch except that a zero value is clocked into the Q output when in_clk is asserted high. As with the LL latch, the output Q of the LZIL latch takes on the value of the input in_data when in_load is asserted high. The NLL latch is similar to the LL latch except that it does not have a data input that is loaded with the in_load signal. As with the LL latch, the output Q takes on the value of the input clk_data when in_clk is asserted high. The output Q of each of the LZIL latch and the NLL latch is cleared to zero when reset_not is asserted low.

Figure 8:
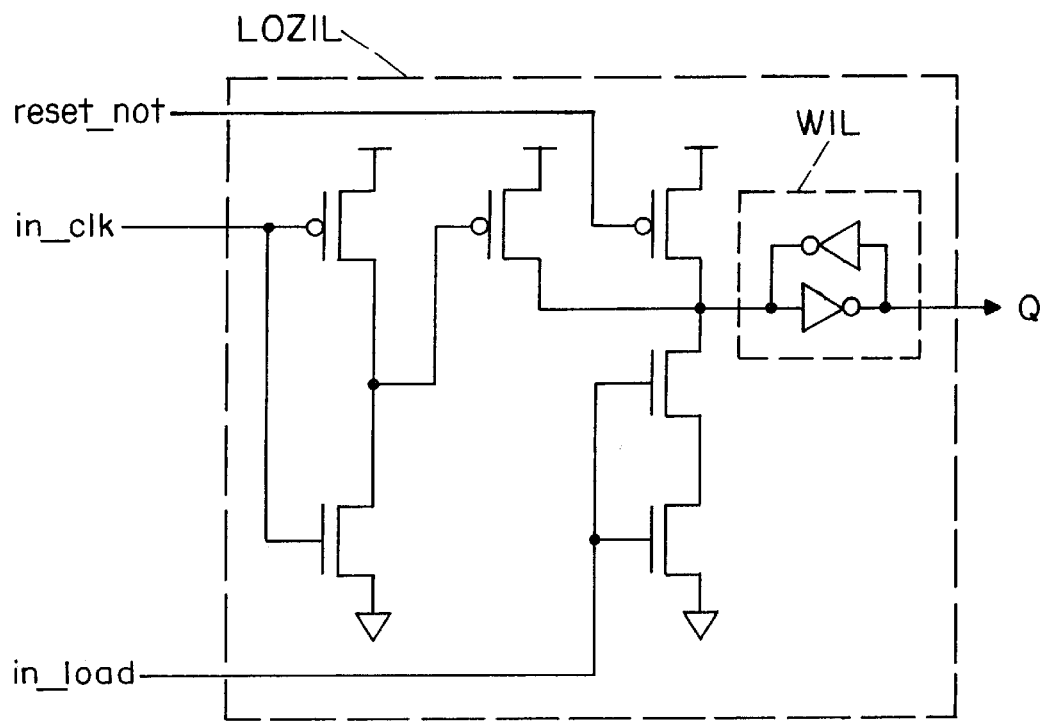
FIG. 8 is a schematic diagram of a latch of an input buffer according to the embodiment of FIG. 4.
Figure 9:
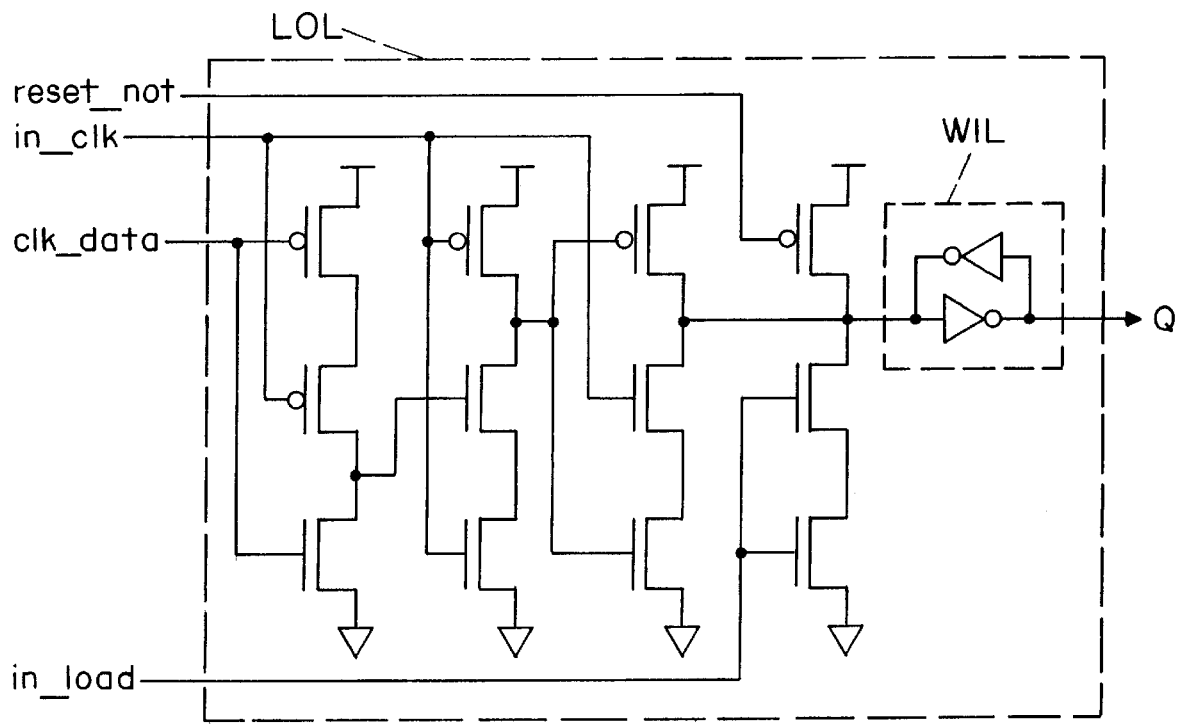
FIG. 9 is a schematic diagram of a latch of an input buffer according to the embodiment of FIG. 4.

FIGS. 8 and 9 are schematic diagrams of preferred embodiments of the LOZIL and LOL latches, respectively. The LOZIL and LOL latches will always load a value of "1" onto the output Q when in_load is asserted high. In addition, for the LOZIL latch, the output Q takes on a zero value when in_clk is asserted high. For the LOL latch, the output Q takes on the value of the input clk_data when in_clk is asserted high. For both the LOZIL and the LOL latches, the output Q is cleared to zero when reset_not is asserted low.

Figure 10:
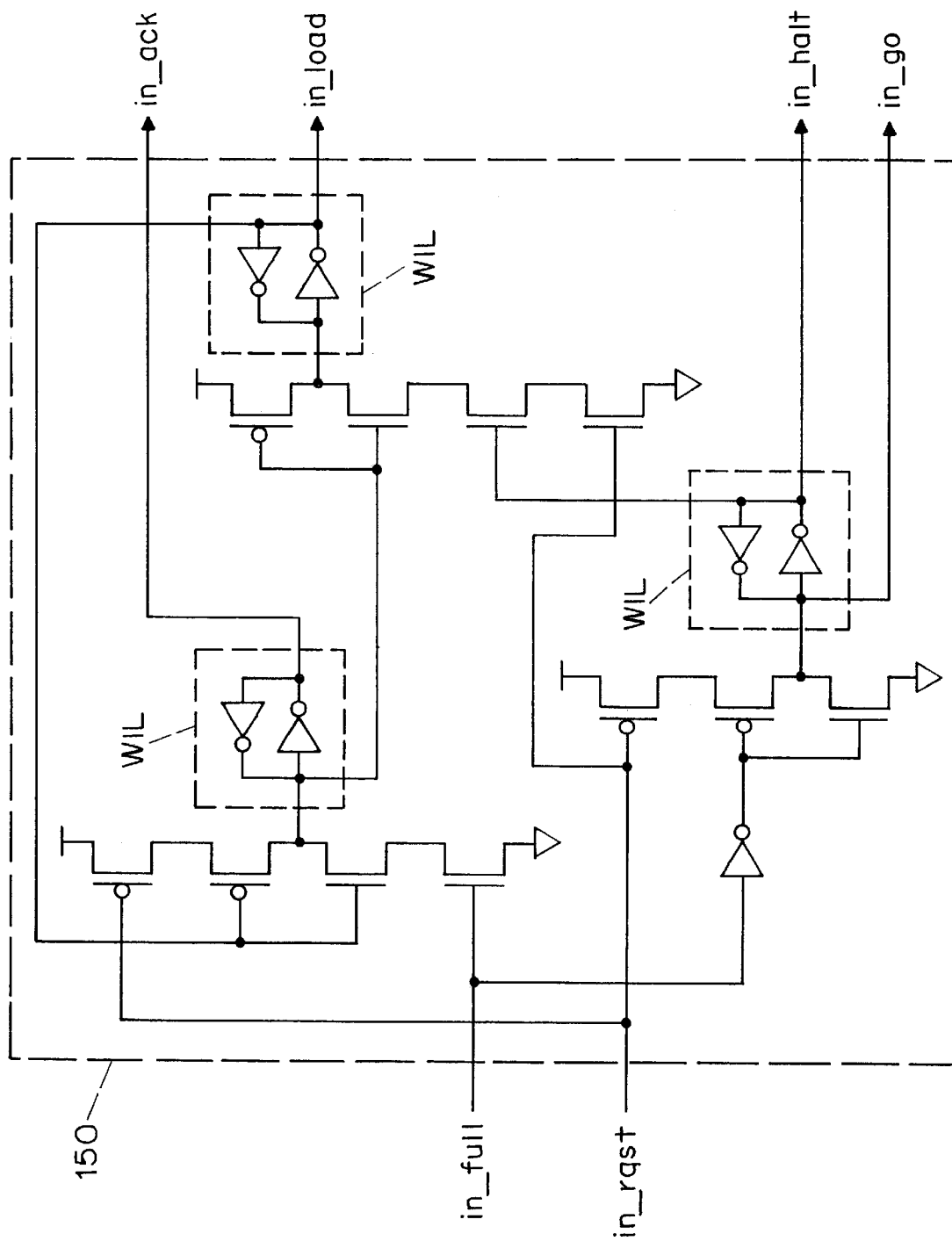
FIG. 10 is a schematic diagram of a reload sequencer circuit of a decoder according to the embodiment of FIG. 1B.
Figure 11:
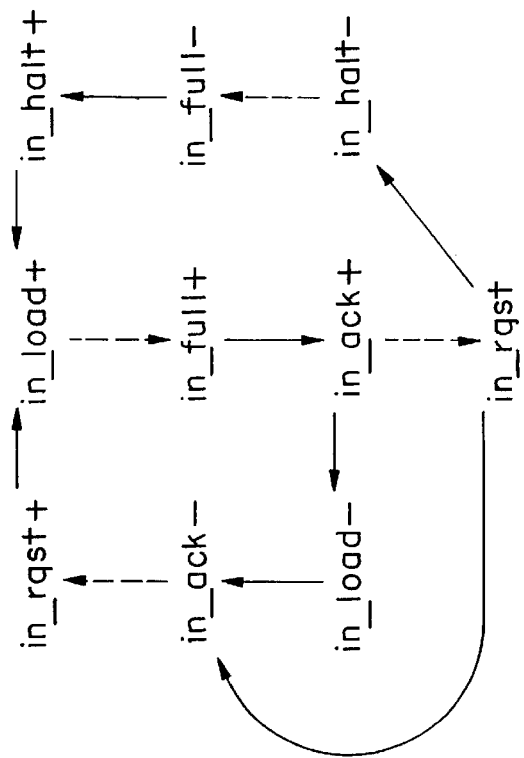
FIG. 11 is a signal transition diagram for the reload sequencer circuit of FIG. 10.

FIG. 10 shows a schematic diagram of a preferred embodiment of the reload sequencer circuit 150. The circuit is implemented using dynamic logic p-channel and n-channel MOS transistors with weak-feedback inverter loops (WILs) at the output stages. The operation of the circuit will be explained with reference to FIG. 11, which shows a signal transition diagram for the inputs and outputs of the circuit of FIG. 10. The solid arrows in FIG. 11 represent transitions of signals generated by the reload sequencer circuit 150 (signal outputs), and the dashed arrows represent transitions of signals generated by circuitry external to the reload sequencer circuit 150 (signal inputs). A minus sign ("−") at the end of a signal represents a high-to-low transition, and a plus sign ("+") at the end of a signal represents a low-to-high transition.

Referring to FIG. 11, it is assumed for the purposes of discussion that the in_rqst signal is low (represented by the state in_rqst−). When in_rqst is low, the signals in_ack and in_halt are driven low (represented by the states in_ack− and in_halt−). In_remains low until the input signal in_full goes low (represented by the state in_full−), When in_full goes low, indicating that the input buffer is empty, in_halt is driven high (state in_halt+).

A high transition on the input signal in_rqst (represented by the state $in_{13}$ rqst+) indicates that input data is available. When both $in_{13}$ rqst and in_halt are high, indicating that data is available and the input buffer is empty, the in_load signal is driven high (represented by the state in_load+). The high transition of the in_load signal clocks the available input data into the input buffers. When the data is properly latched, the in_full signal goes high (represented by state in_full+), indicating that the input buffer is full. When the signal in_full is high, the signal in_ack is driven high (represented by the state in_ack+), acknowledging latching of the input data. After in_goes high, the reload sequencer circuit 150 waits for in rqst to go low (represented by the state in_rqst−), which completes the cycle.

Figure 12:
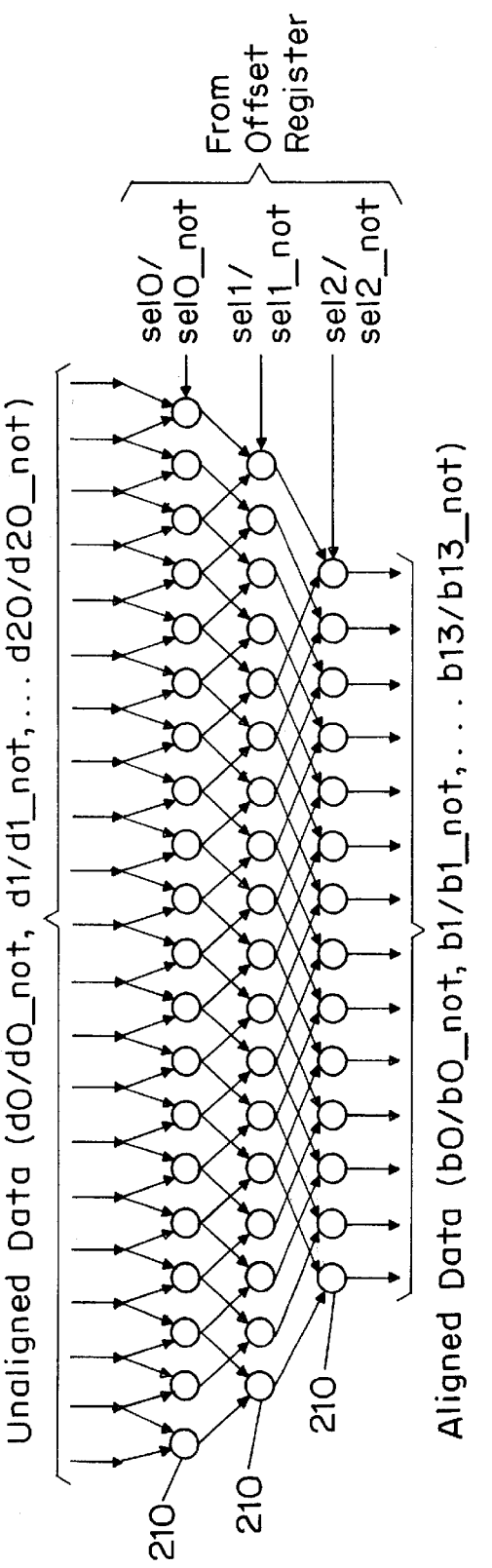
FIG. 12 is a functional block diagram of an alignment circuit of a decoder according to the embodiment of FIG. 1B.

FIG. 12 is a functional block diagram of a preferred embodiment of the alignment circuit 200 of the decoder of FIG. 1B. The alignment circuit is implemented as a barrel shifter with dual-rail inputs and outputs. The barrel shifter of FIG. 12 comprises three stages of two-to-one multiplexers 210, which shift the unaligned data from the input buffer by an amount indicated by the dual-rail signal pairs sel0/sel0_not, sel1/sel1_not, and sel2/sel2_not from the offset register 900. The output of the alignment circuit 200 are the dual-rail, aligned data bits b0/b0_not:b13/b13_not.

Figure 13:
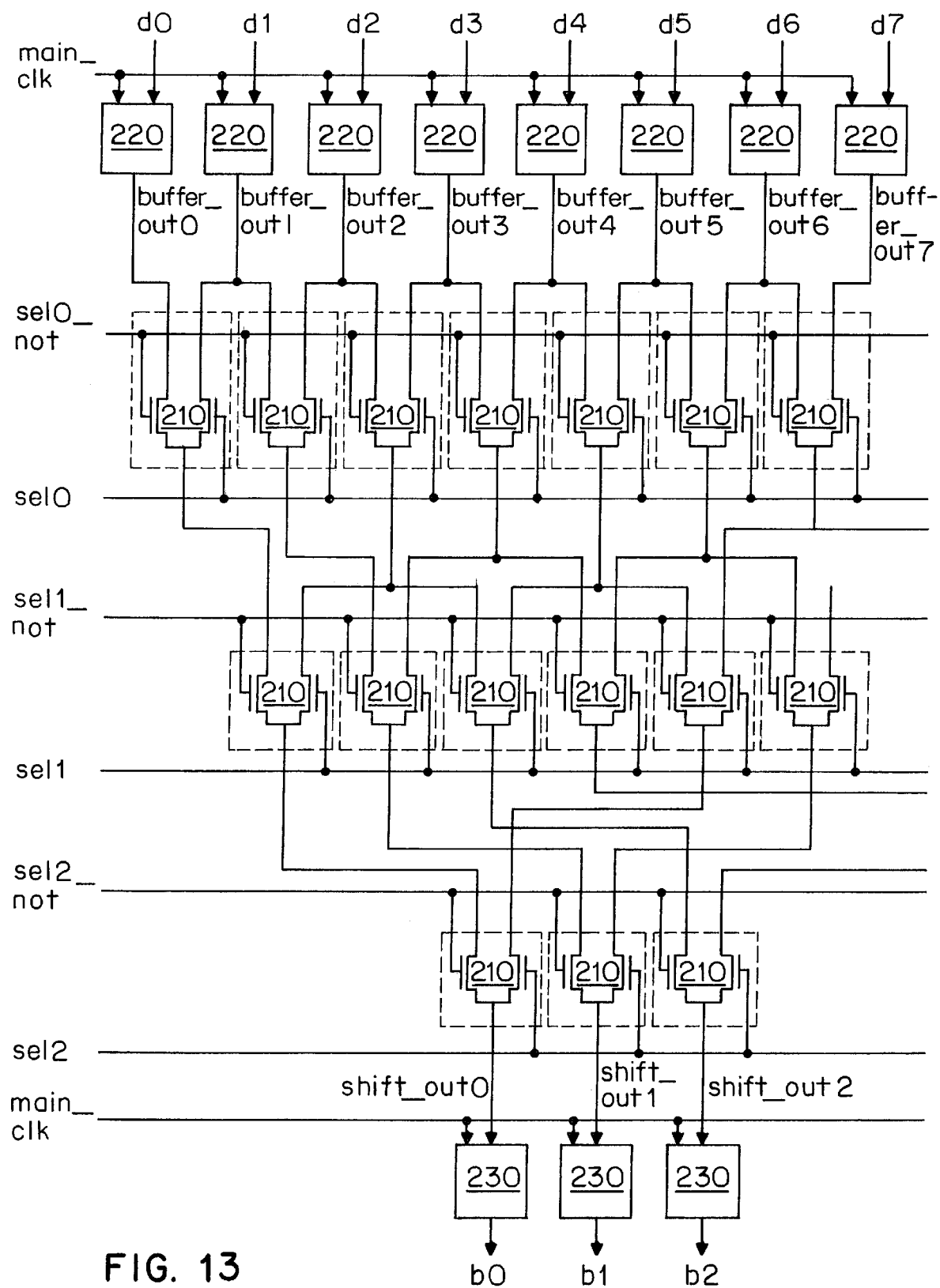
FIG. 13 is a partial functional block diagram of an alignment circuit according to the embodiment of FIG. 12.

FIG. 13 is a partial schematic diagram of a preferred embodiment of the alignment circuit of FIG. 12. The circuitry for only eight data bits (d0:d7) of the unaligned data is shown, but it is within the ability of those of ordinary skill in the art to complete the circuit for the remaining data bits (d8:d20). In addition, the unaligned data bits d0:d20 are inverted (not shown) to produce complements d0_not:d20_not, and the circuit of FIG. 13 is repeated for these complements.

As shown in FIG. 13, each of the two-to-one multiplexers 210 of the alignment circuit 200 of FIG. 12 is implemented simply as two n-channel MOS transistors, with the sources of the transistors serving as inputs coupled to a previous stage, the bases serving as control inputs coupled to the appropriate seln/seln_-not signal (where n is 0, 1, or 2), and the drains connected together and serving as the output to a subsequent stage.

FIG. 13 also shows that the alignment circuit has a plurality of input buffers 220 and output buffers 230 on the input and output stages, respectively, of the multiplexer network. Each unaligned data bit d0:b20 and each of the complements of the unaligned data bits d0_not:b20_not are buffered by an input buffer 220. Each aligned data bit b0:b13 and each of the complements of the aligned data bits b0_not:b13_not are buffered by an output buffer 230. The buffers 220 and 230 are used to produce dual rail signals.

Figure 14:
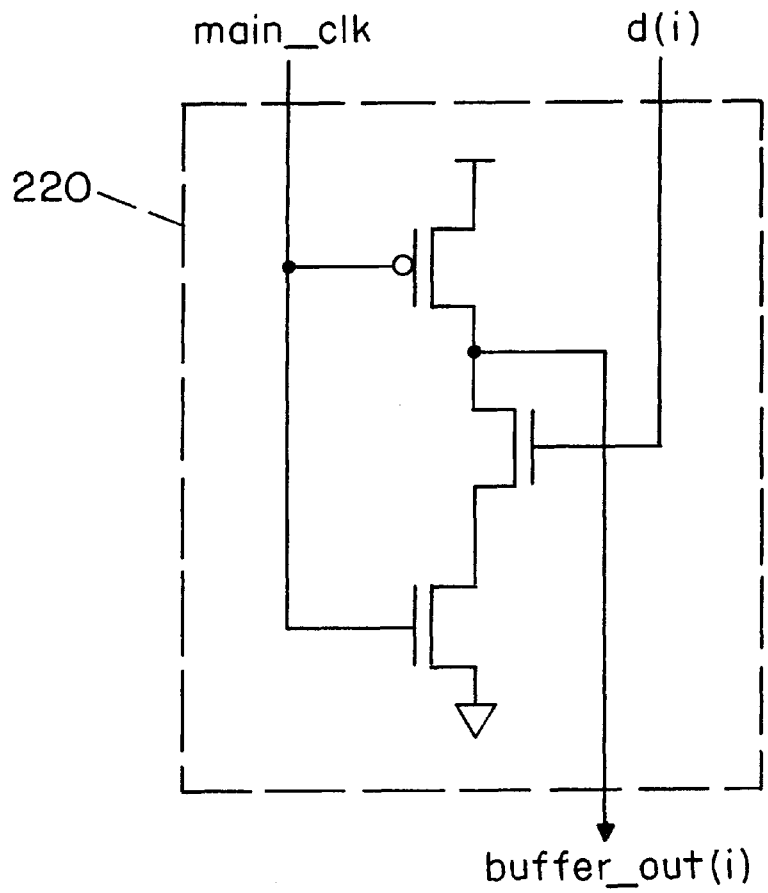
FIG. 14 is a schematic diagram of a buffer of an alignment circuit according to the embodiment of FIG. 13.

FIG. 14 is a schematic diagram of a preferred embodiment of an input buffer 220 used in the alignment circuit of FIG. 13. The buffer 220 comprises two p-channel MOS transistors and one n-channel MOS transistor. The buffer receives the global synchronization signal main_clk and one of the unaligned data bits d0:d20 (represented by the input signal d(i)). The output of the buffer buffer_out(i) precharges high when the synchronization signal main_clk is low and is pulled low when the synchronization signal main_clk and the data input d(i) are high. When the synchronization signal main_clk is high and the data input d(i) is low, the output buffer_out(i) will remain in its high, precharged state. It is noted that the output buffer_out(i) is an inverted version of the data input d(i) when the synchronization signal main_clk is high.

Figure 15:
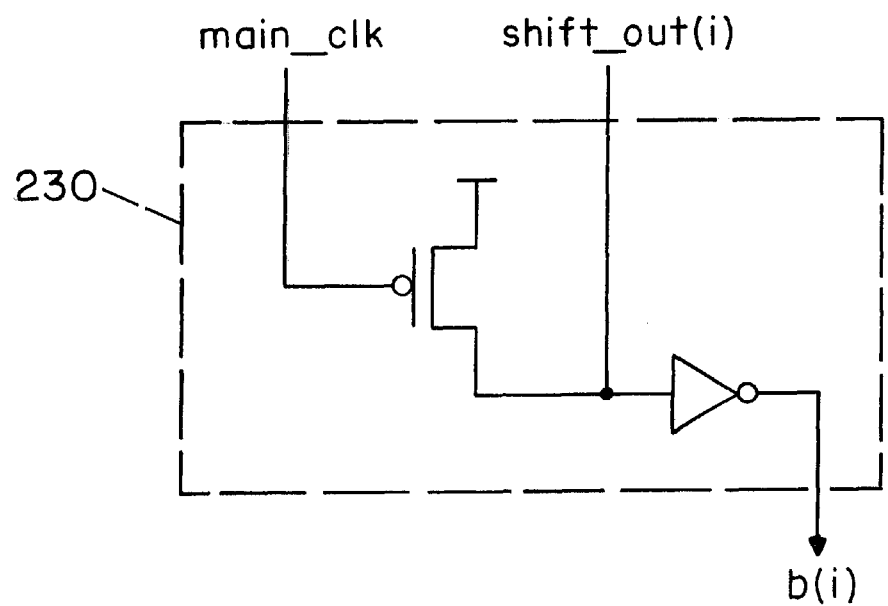
FIG. 15 is a schematic diagram of a buffer of an alignment circuit according to the embodiment of FIG. 13.

FIG. 15 is a schematic diagram of a preferred embodiment of an output buffer 230 used in the alignment circuit of FIG. 13. The buffer 230 comprises an n-channel pull-up MOS transistor and an output inverter. The buffer receives the global synchronization signal main_clk and one of the output bits shift_out0:shift_out13/shift_out_not0:shift_out_not13 from the last stage of the multiplexer network (represented by the input signal shift_out(i)).

When the synchronization signal main_clk is low, the output of the n-channel MOS transistor precharges high and the output of the inverter b(i) is driven low. When the synchronization signal main_clk is high, the n-channel MOS transistor is off, and the inverter is driven by the input shift_out(i). It is noted that the inverter of the output buffer 230 reverses the inversion performed by the input buffer 220.

Figure 16:
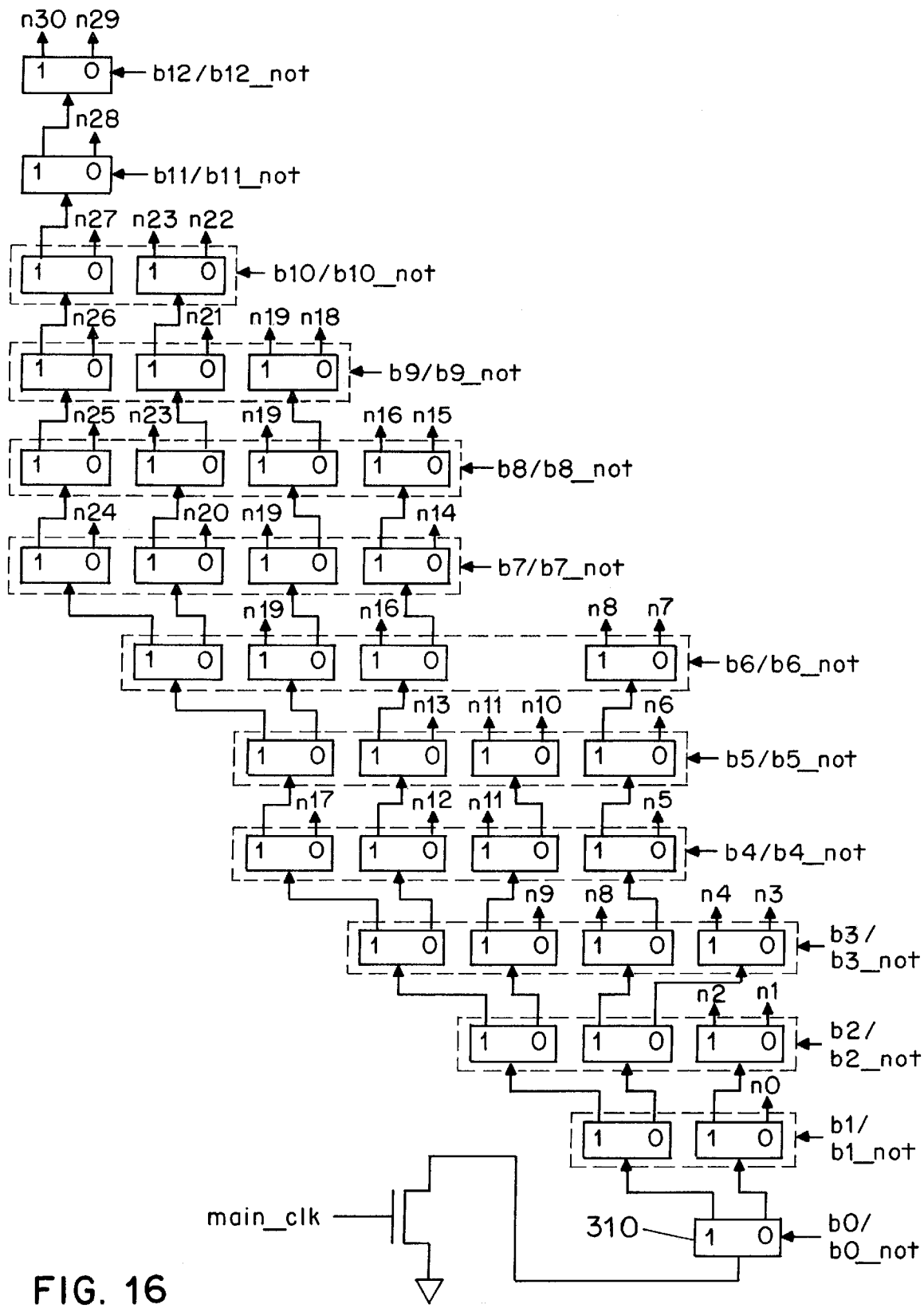
FIG. 16 is a functional block diagram of a preferred embodiment of a match logic circuit of a decoder according to the embodiment of FIG. 1B.

FIG. 16 is a functional block diagram of a preferred embodiment of the match logic circuit 300 of the decoder of FIG. 1B. The match logic circuit 300 comprises a plurality of decoders 310 arranged in a tree structure having 31 one-hot outputs n0:n31, each of which corresponds to one of the classes in Table 2 (i.e., n0 corresponds to class 0, n1 corresponds to class 1, etc.).

Figure 18:
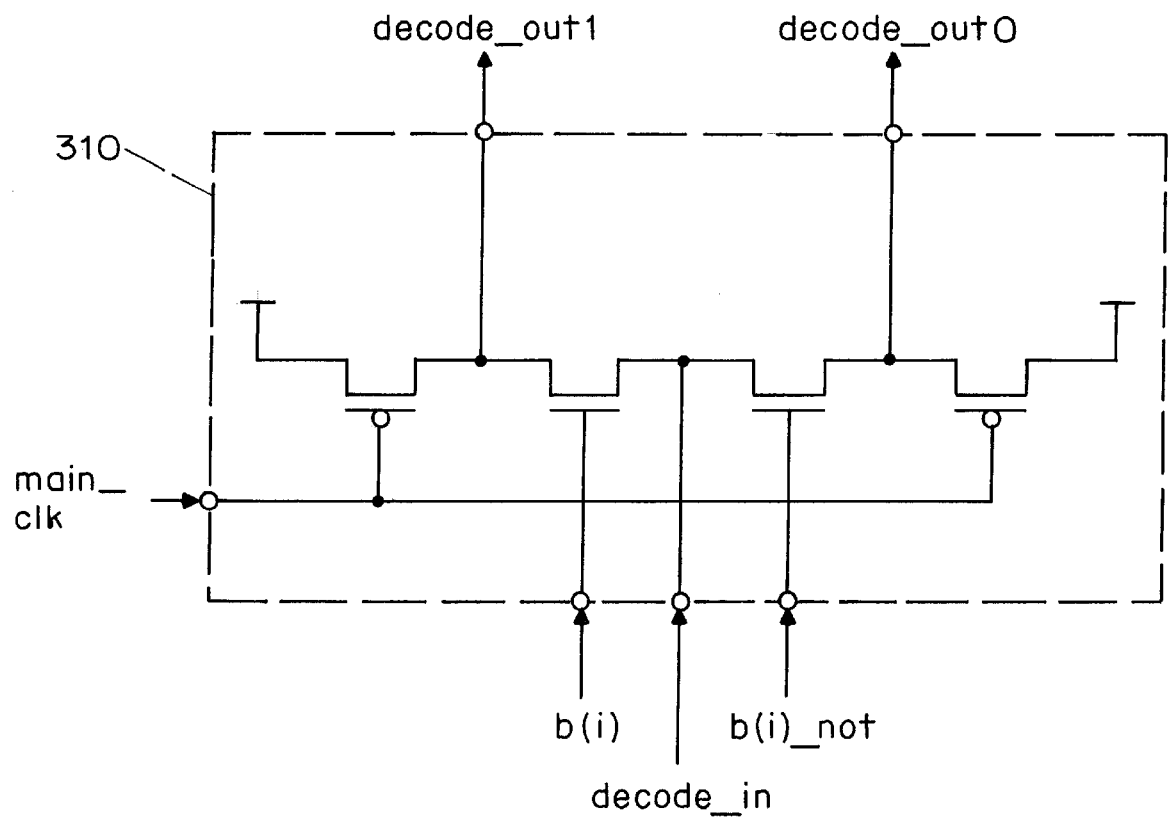
FIG. 18 is a schematic diagram of a decoder of a match logic circuit according to the embodiment of FIG. 16.

FIG. 18 is a schematic diagram of a preferred embodiment of a decoder 310 used in the match logic circuit of FIG. 16. The decoder 310 has a precharge input coupled to the synchronization signal main_clk. The decoder 310 thus precharges when main_clk is low and evaluates its other inputs when main_clk is high. The decoder 310 receives one dual-rail bit pair of the aligned data b0/b0_not:b13/b13_not from the alignment circuit 200, designated as b(i) and b(i) not in FIG. 18. The decoder 310 also has an enable input, designated decode_in, and two outputs, decode_out0 and decode_out1. After precharge, if decode_in remains high, both decode_out0 and decode_out1 remain high. If decode_in goes low after precharge, decode_out0 goes low if b(i) is low and b(i) not is high, and decode_out1 goes low if b(i) is high and b(i)_not is low.

Returning to FIG. 16, the plurality of decoders 310 are arranged in a tree-like configuration, with the input decode_in of each decoder being driven by one of the outputs of the decoders in a prior stage. The first decoder at the root of the tree is driven by a single n-channel MOS transistor controlled by main_clk. When main_clk is high, enabling the first decoder, an enable signal propagates from the root of the tree through each successive stage until an output node (one of n0:n30) is reached.

Figure 17:
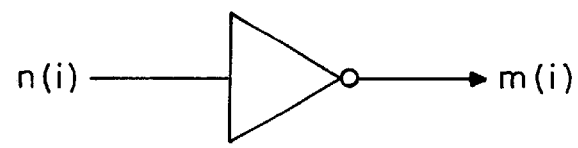
FIG. 17 is a functional block diagram of an inverter circuit for the outputs of a match logic circuit according to the embodiment of FIG. 16.

In some cases, a single match class may have several output nodes, which are connected together in a wire-OR circuit. As shown in FIG. 17, the output nodes n0:n30 of the match logic circuit of FIG. 16 are inverted before being passed to subsequent stages. The inverted outputs are designated m) through m30.

Note that the match logic circuit of FIG. 16 is implemented such that the shortest, and thus most common, codes are matched using the fewest levels of logic. Therefore, the average response time for the circuit is much faster than the worst case response time. Because a deep N-channel stack is used to detect matches with the longest code, it is preferred that the bottom three transistors in the stack be widened by two to four times the normal width to improve the performance of the stack.

Figure 19:
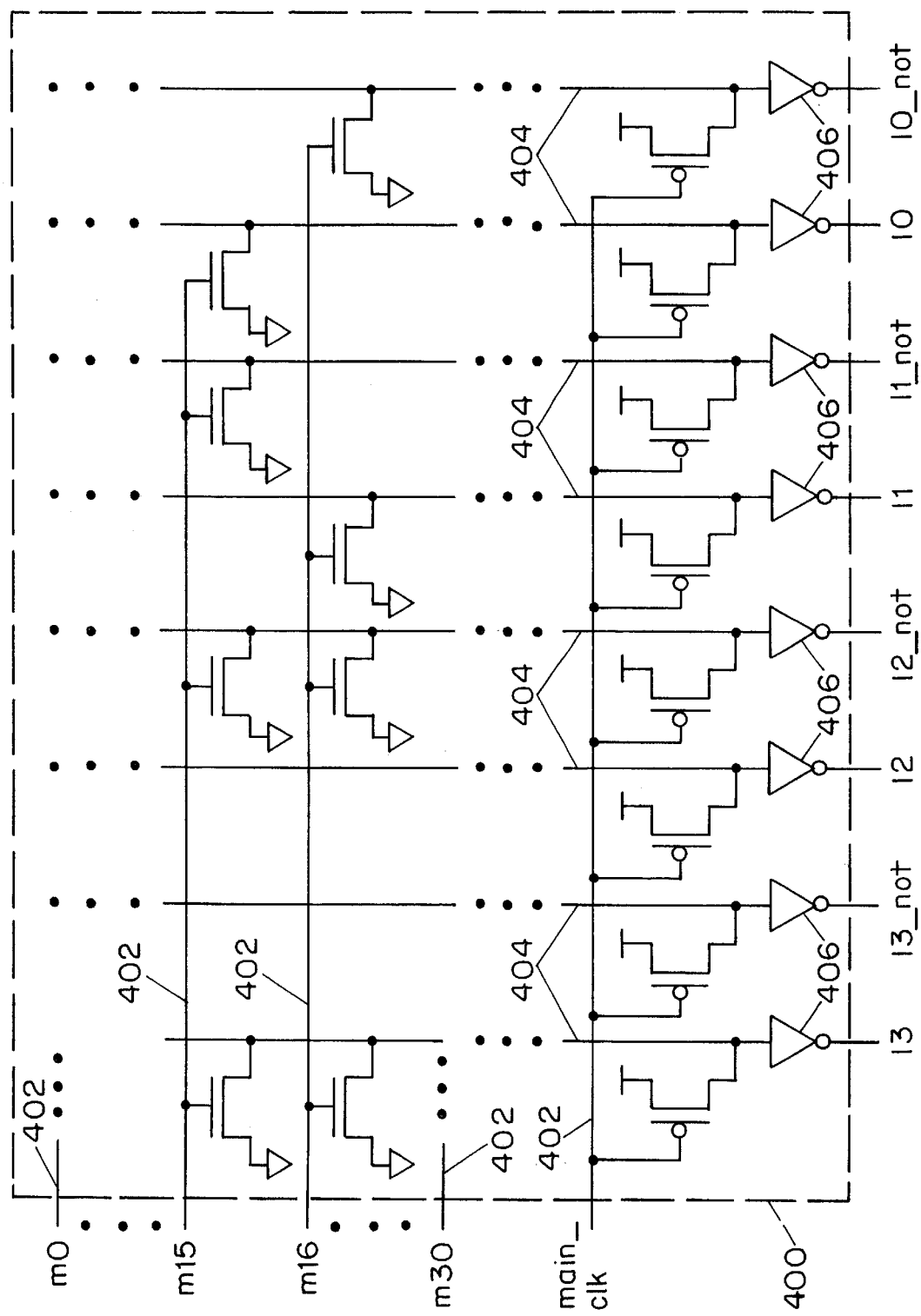
FIG. 19 is a partial functional block diagram of a symbol decoder ROM of a decoder according to the embodiment of FIG. 1B.

FIG. 19 is a partial schematic diagram of a preferred embodiment of the length ROM 400 of the decoder of FIG. 1B. It is within the ability of those of ordinary skill in the art to complete the circuit. The length ROM 400 receives as inputs the 31 one-hot class indicator signals m0:m30 and the synchronization signal main_clk. Based on these signals, the length ROM 400 outputs a four-bit binary representation of the length of the Huffman code associated with the class indicated by the signals m0:m 30. (Only four bits are needed because the longest Huffman code is fourteen bits). Each output bit is a dual rail signal; thus, there are a total of eight output signals: l3, l3_not, l2, l2_not, l1, l1_not, l0, and l0_not. The bit pair l3/l3_not is the most significant bit pair of the length output, and the bit pair l0/l0_not is the least significant bit pair of the length output.

Preferably, the length ROM 400 is an array having 32 word lines 402 running cross-wise against 8 bit lines 404. Each of the bit lines 404 is coupled to an output signal through an inverter 406. One of the word lines is coupled to the synchronization signal main_clk, and the other word lines are coupled to the m0:m30 signals. As shown in FIG. 19, the word line coupled to main_clk has a series of n-channel pull-up transistors coupling the main_clk word line to each bit line. In addition, the m0:m30 word lines have p-channel pull-down transistors coupling the word lines and bit lines in appropriate intersections, to thereby provide a binary-coded representation of the length of the code word associated with that word line.

When the main_clk signal is low, all of the bit lines 404 are precharged to a logic high state. When the main_clk signal is high, the hot signal from the m0:m31 input signals will turn on the p-channel pull-down transistors coupled to the its word line, driving the appropriate bit lines low, and thereby producing a value on the outputs representative of the length of the code word associated with the hot input signal.

As a specific example, turning to FIG. 19, pull-down transistors couple the m15 word line and the l3,l2_not, l1_not, and l0 bit lines. Thus, when the m15 signal is hot (high) and the main_clk signal is high, the l3,l2_not, l1_not, and l0 outputs will be high and the l3_not, l2, l1, and l0_not outputs will be low, corresponding to a binary value of 1001. This binary value corresponds to a code word length of nine.

Figure 20:
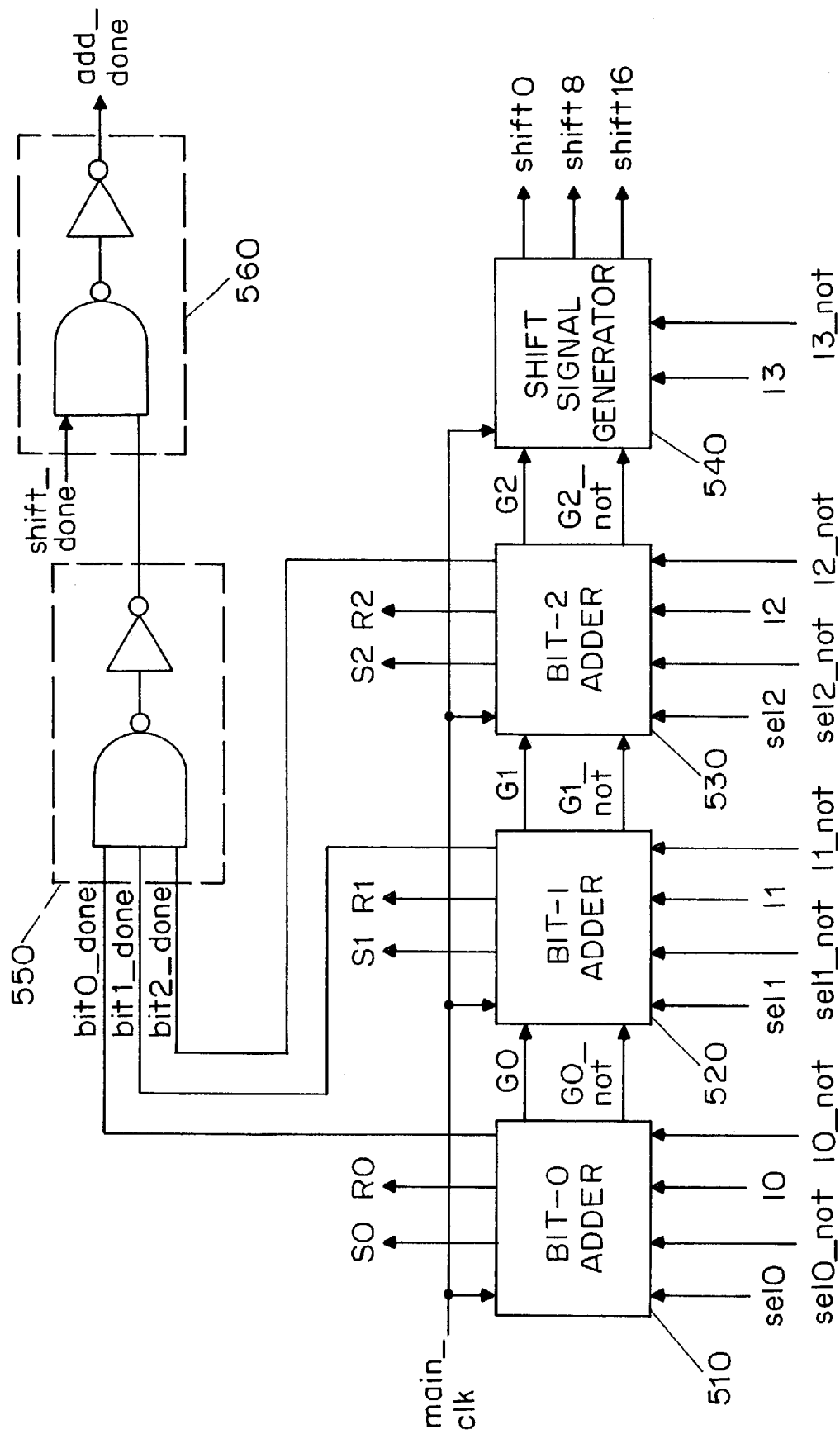
FIG. 20 is a functional block diagram of an adder circuit of a decoder according to the embodiment of FIG. 1B.

FIG. 20 is a functional block diagram of a preferred embodiment of the adder circuit 500 of the decoder of FIG. 1B. The adder circuit 500 is a three-stage ripple-carry adder, with a final stage that determines the number of shifts to be performed by the input buffer. Each stage of the adder circuit 500 utilizes the synchronization signal main_clk as a precharge/evaluate input.

The ripple-carry portion of the adder circuit 500 includes a bit-0 adder 510, a bit-1 adder 520, and a bit-2 adder 530. The bit-0 adder 510 takes as inputs the dual-rail bit pair l0/l0_not from the length ROM 400 and the dual-rail bit pair sel0/sel0_not from the offset register 900. The bit-0 adder 510 outputs a set/reset signal pair S0/R0, a completion signal bit0_done, and a carry-out dual-rail bit pair G0/G0_not.

The bit-1 adder 520 takes as inputs the dual-rail bit pair l1/l1_not from the length ROM 400, the dual-rail bit pair sel1/sel1_not from the offset register 900, and the dual-rail bit pair G0/G0_not from the bit-0 adder 510. The bit-1 adder 520 outputs a set/reset signal pair S1/R1, a completion signal bit1_done, and a carry-out dual-rail bit pair G1/G1_not.

The bit-2 adder 530 takes as inputs the dual-rail bit pair l2/l2_not from the length ROM 400, the dual-rail bit pair sel2/sel2_not from the offset register 900, and the dual-rail bit pair G1/G1_not from the bit-1 adder 520. The bit-2 adder 530 outputs a set/reset signal pair S2/R2, a completion signal bit2_done, and a carry-out dual-rail bit pair G2/G2_not.

The three completion signals bit0-done, bit1_done, and bit2_done are combined by an AND gate 550, and the output of the AND gate 550 is combined with a signal shift_ack from the shift sequencer circuit 800 through another AND gate 560. The output of the AND gate 560 is the signal add_done, which indicates the completion of the adder circuit 500.

The final stage of the adder circuit 500 is the shift signal generator 540, which takes as inputs the dual-rail bit pair l3/l3_not from the length ROM 400 and the dual-rail bit pair G2/G2_not from the bit-2 adder 520. Based on these inputs, the shift signal generator 540 produces three one-hot signals, shift0, shift8, and shift16, which correspond to a zero-byte shift (no shift), a one-byte shift, and a two-byte shift of the input buffer, respectively.

Figure 21:
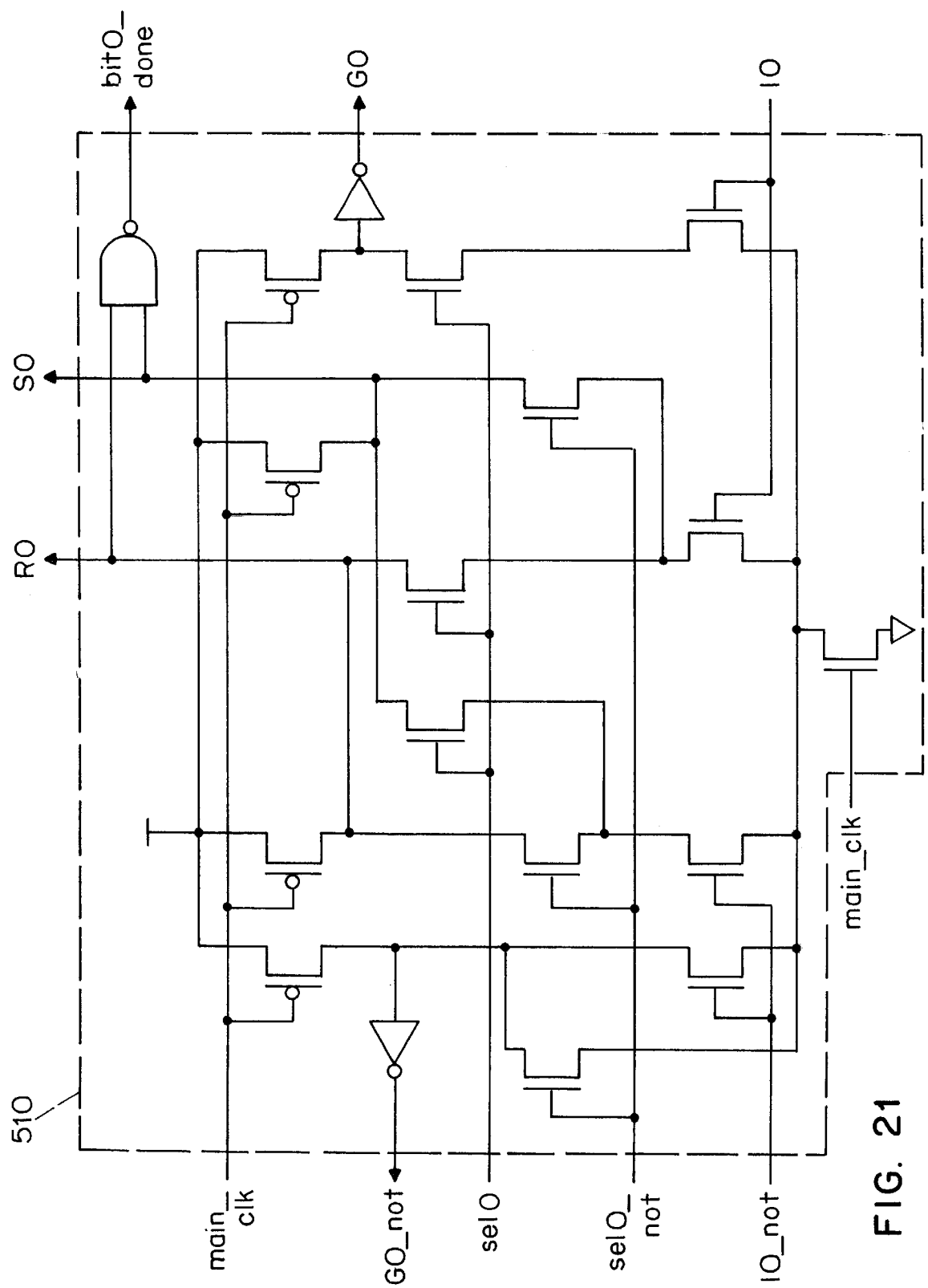
FIG. 21 is a schematic diagram of a "bit 0" circuit of an adder circuit according to the embodiment of FIG. 20.

FIG. 21 is a schematic diagram of a preferred embodiment of the bit-0 adder 510 of FIG. 20. When main_clk is low, the bit-0 adder 510 precharges and the outputs S0 and R0 are high, and the outputs bit0_done, G0 and G0_not are low. When main_clk is high, the bit-0 adder 510 is able to evaluate its inputs. The outputs of the bit-0 adder 510 during the evaluation stage are shown in Table 3. As shown in FIG. 21, the completion signal bit0_done is a logical NAND of the R0 and S0 signals.

TABLE 3

Bit-0 Adder Logic

| Inputs | | Outputs | | |
|---|---|---|---|---|
| sel0 | I0 | R0 | S0 | G0 |
| 0 | 0 | 0 | 1 | 0 |
| 0 | 1 | 1 | 0 | 0 |
| 1 | 0 | 1 | 0 | 0 |
| 1 | 1 | 0 | 1 | 1 |

Figure 22:
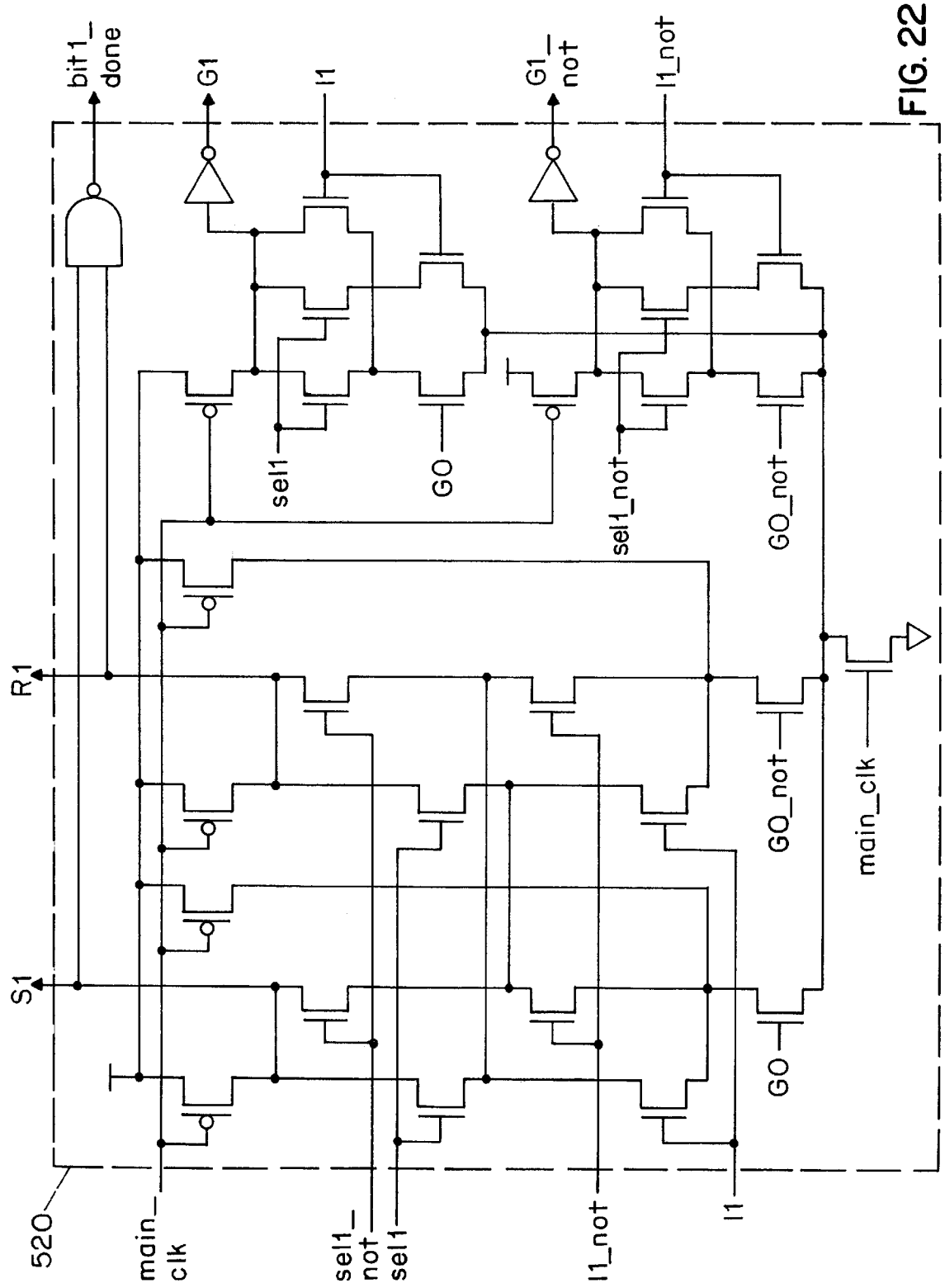
FIG. 22 is a schematic diagram of a "bit 1" circuit of an adder circuit according to the embodiment of FIG. 20.

FIG. 22 is a schematic diagram of a preferred embodiment of the bit-1 adder 520 of FIG. 20. When main_clk is low, the bit-1 adder 520 precharges; therefore, the outputs S1 and R1 are high, and the outputs bit1_done, G1 and G1_not are low. When main_clk is high, the bit-1 adder 520 is able to evaluate its inputs. The outputs of the bit-1 adder 520 during the evaluation stage are shown in Table 4. As shown in FIG. 22, the completion signal bit1_done is a logical NAND of the R1 and S1 signals.

The bit-2 adder 530 of FIG. 20 may be implemented with the identical circuitry shown in FIG. 22 for the bit-1 adder 520, with the inputs and outputs of the bit-2 adder 530 replacing the corresponding inputs and outputs of the bit-1 adder 520 (i.e., sel2 replacing sel1, I2 replacing I1, etc.).

TABLE 4

Bit-1 Adder Logic

| Inputs | | | Outputs | | |
|---|---|---|---|---|---|
| G0 | I1 | sel1 | R1 | S1 | G1 |
| 0 | 0 | 0 | 0 | 1 | 0 |
| 0 | 0 | 1 | 1 | 0 | 0 |
| 0 | 1 | 0 | 1 | 0 | 0 |
| 0 | 1 | 1 | 0 | 1 | 1 |
| 1 | 0 | 0 | 1 | 0 | 0 |
| 1 | 0 | 1 | 0 | 1 | 1 |
| 1 | 1 | 0 | 0 | 1 | 1 |
| 1 | 1 | 1 | 1 | 0 | 1 |

Figure 23:
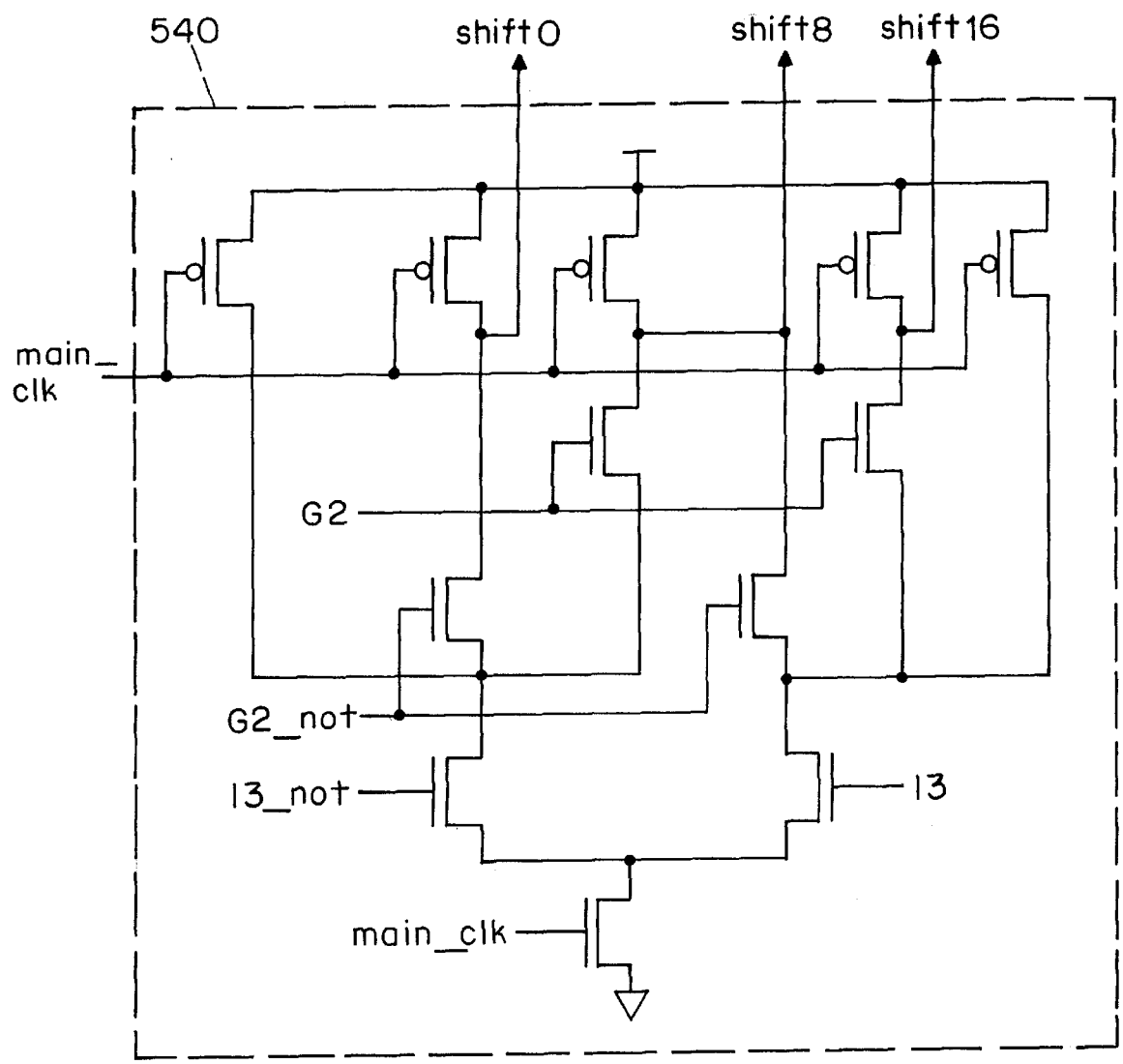
FIG. 23 is a schematic diagram of a "shift" circuit of an adder circuit according to the embodiment of FIG. 20.

FIG. 23 is a schematic diagram of a preferred embodiment of the shift signal generator 540 of FIG. 20. The outputs shift0, shift8, and shift16 are one-hot outputs. When the synchronization signal main_clk is low, the shift signal generator 540 precharges and the outputs shift0, shift8, and shift16 are high. When main_clk is high, the shift signal generator circuit 540 evaluates its inputs G2/G2_not and I3/I3_not. The outputs of the shift signal generator circuit 540 during its evaluation stage are shown in Table 5.

TABLE 5

Shift Signal Generator Logic

| Inputs | | Outputs | | |
|---|---|---|---|---|
| I3 | G2 | shift0 | shift8 | shift16 |
| 0 | 0 | 0 | 1 | 1 |
| 0 | 1 | 1 | 0 | 1 |
| 1 | 0 | 1 | 0 | 1 |
| 1 | 1 | 1 | 1 | 0 |

Figure 24:
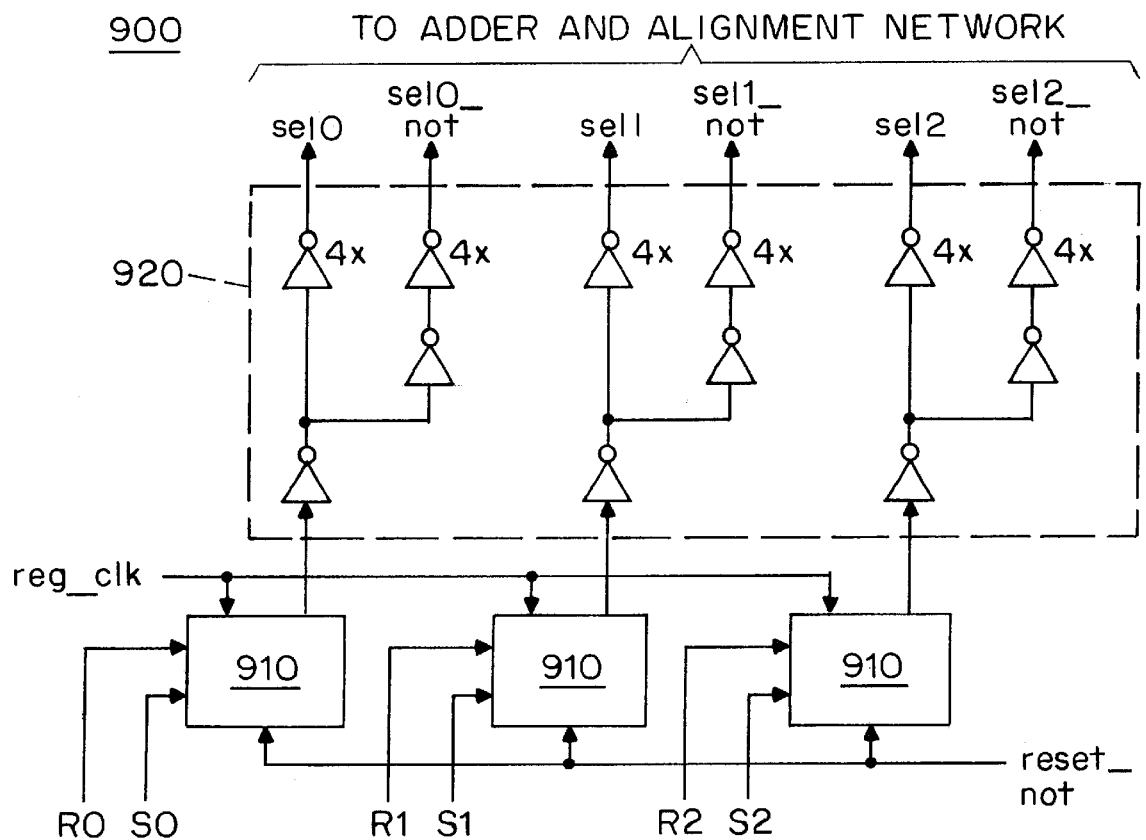
FIG. 24 is a functional block diagram of a preferred embodiment of an offset register of a decoder according to the embodiment of FIG. 1B.

FIG. 24 is a functional block diagram of a preferred embodiment of the offset register 900 of FIG. 1B. The offset register 900 includes three identical edge-triggered latches 910 and register buffers 920. Each of the latches 910 receives a pair of the set/reset signals (S0/R0, S1/R1, and S2/R2) from the adder circuit 500. In addition, the latches are triggered by a clock signal reg_clk, which is generated by the timing circuit 1000 (of FIG. 1B) and which is derived from the synchronization signal main_clk. The derivation of reg_clk will be explained further below. When reg_clk goes high, the latches 910 latch the values dictated by the set/reset signals. Each of the latches 910 has a single output, which when buffered through the inverter register buffers 920 as shown in FIG. 24 produce a complementary pair of signals (sel0/sel0_not, sel1/sel1_not, or sel2/sel2_not).

Figure 25:
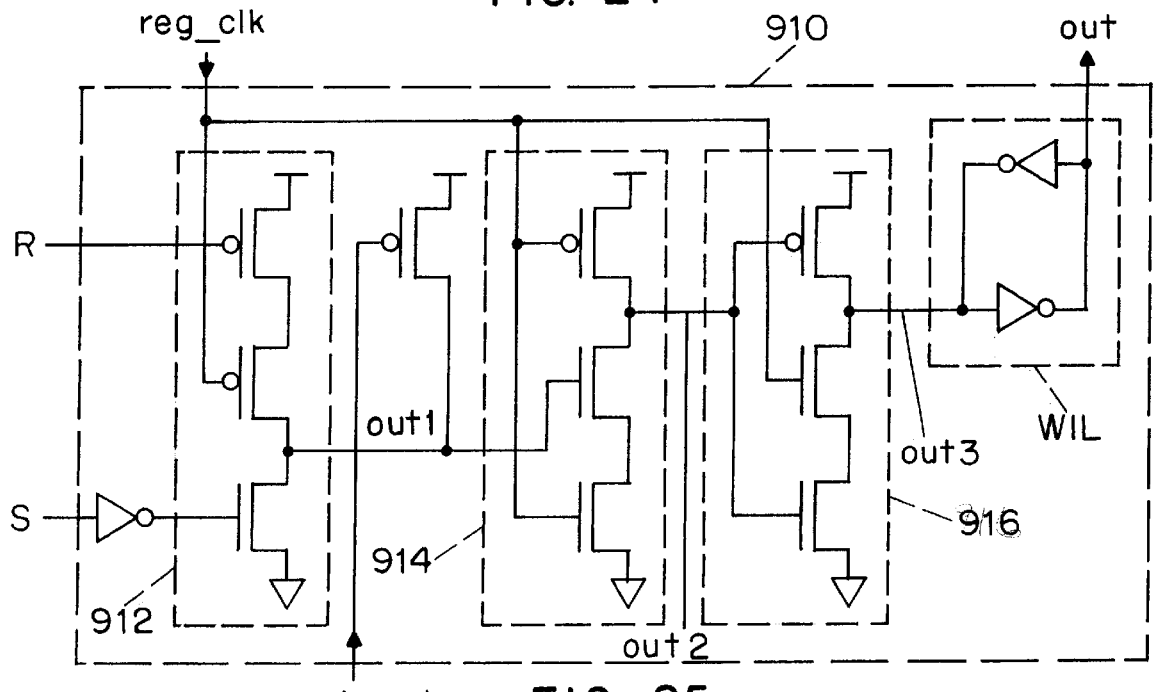
FIG. 25 is a schematic diagram of a preferred embodiment of an RS latch of an offset register according to the embodiment of FIG. 24.

FIG. 25 is a schematic diagram of a preferred embodiment of an edge-triggered latch 910 used in the offset register of FIG. 24. The latch 910 includes a first stage 912, which receives a set/reset signal pair R/S. When reg_clk is low, the output out1 of the first stage 912 is low if S is low and high if R is low. The output out1 is pulled high when reset_not is low. A second stage 914 receives as an input the output out1 of the first stage 912. When reg_clk is low, the output out2 of the second stage 914 is high. When reg_clk becomes high, the output out2 remains high if out1 is low, but is pulled low if out1 is high. A third stage 916 receives as an input the output out2. The output out3 of the third stage 916 is coupled to the output reg_out of the latch 910 through a weak feedback inverter loop (WIL). When reg_clk is low, the output out3 of the third stage 916 is in a high-impedance state. In this state, the weak feedback inverter loop (WIL) retains the last value of out3. When reg_clk goes high, out3 takes on the inverse value of out2.

Figure 26:
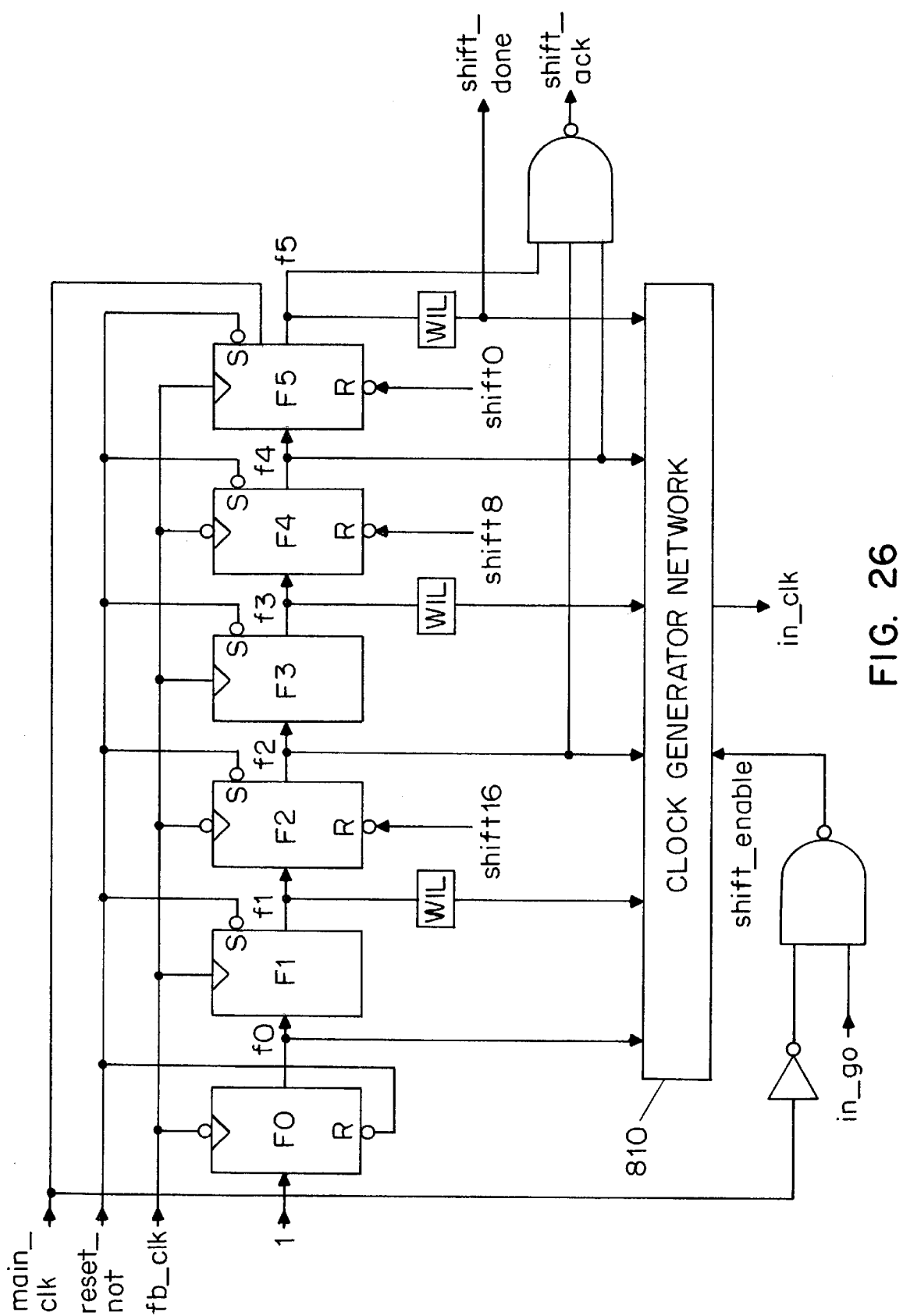
FIG. 26 is a functional block diagram of a preferred embodiment of a shift sequencer circuit of a decoder according to the embodiment of FIG. 1B.
Figure 27:
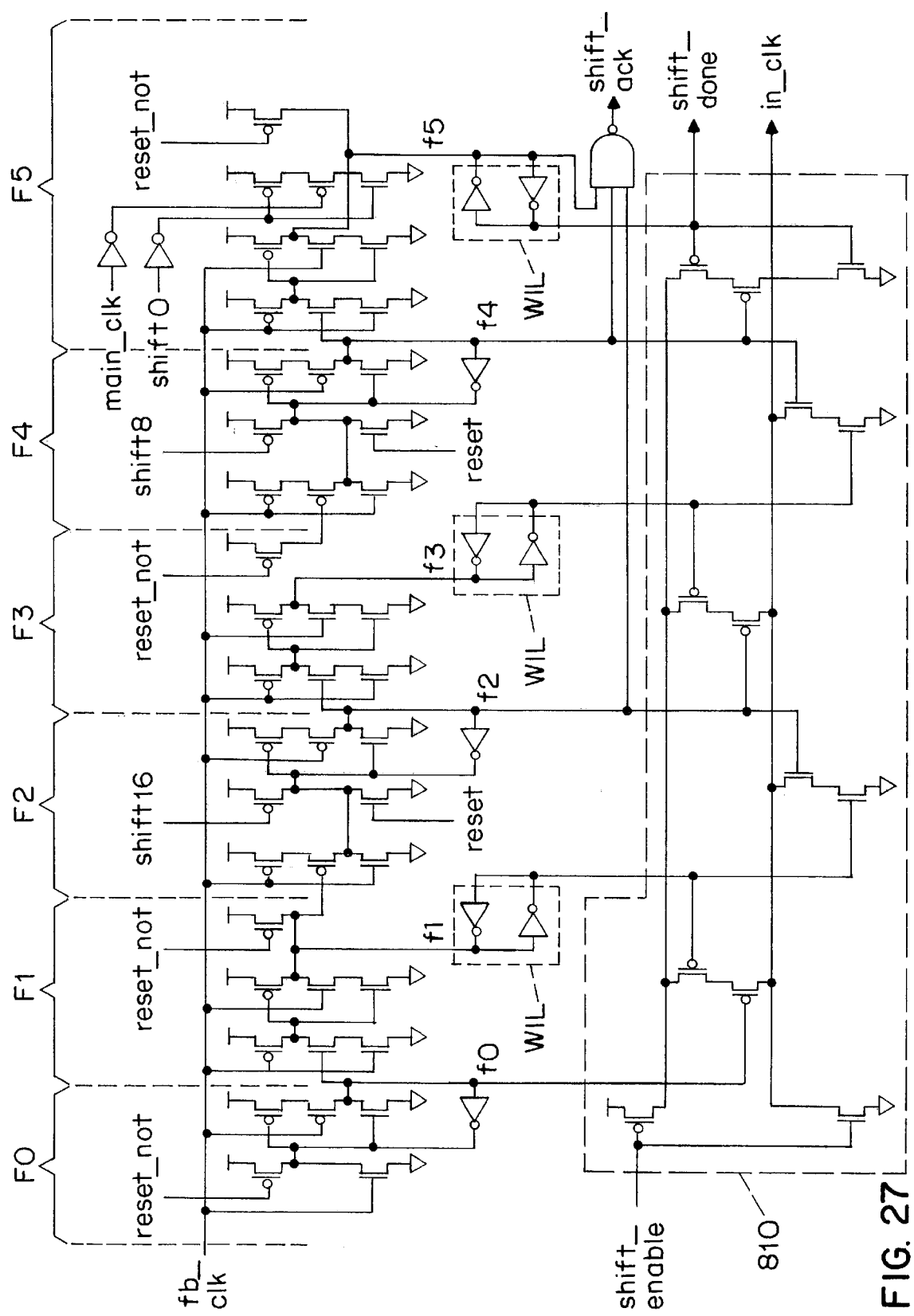
FIG. 27 is a schematic diagram of a preferred embodiment of a shift sequencer circuit according to the embodiment of FIG. 26.

FIG. 26 is a functional block diagram of a preferred embodiment of the shift sequencer circuit 800 of FIG. 1B, and FIG. 27 is a schematic diagram of a preferred embodiment of the shift sequencer circuit 800. The shift sequencer circuit 800 controls the shifting of the input buffer 100 by generating an appropriate number of pulses on the clock signal in_clk. As shown in FIG. 26, the shift sequencer circuit 800 includes six edge-triggered latches F0–F5, which are connected together sequentially (i.e., the data output of a latch is used as the data input for the next latch). The data input of latch F0 is "1".

The latches are triggered by the signal fb_clk, which is a buffered version of in_clk. Latches F0, F2, and F4 are negative edge-triggered (i.e., triggered on a high-to-low transition of fb_clk), and latches F1, F3, and F5 are positive edge-triggered (i.e., triggered on a low-to-high transition of fb_clk).

The "set" inputs of latches F1–F5 are connected to reset or reset_not such that the data outputs f1–f5 of the latches are set to "1" when reset is high or reset_not is low. In addition, the "set" input of latch F5 is further connected to main_clk, such that the data output f5 of latch F5 is set to "1" when main_clk is high.

The "reset" inputs of latches F0, F2, F4, and F5 are connected to the signals reset_not, shift_16, shift_8, and shift_0, respectively. A low on these signals sets the data outputs of the latches to a "0". This "0" propagate through the latches on consecutive cycles of the clock fb_clk. Thus, the signals reset_not, shift 16, shift_8, and shift_0 produce a three-byte, two-byte, one-byte, and zero-byte shift, respectively, of the input buffer 100.

The outputs f0–f5 of the latches F0–F5 are coupled to a clock generating circuit 810, which generates the clock signal in_clk. The outputs f1, f3, and f5 are coupled to the clock generating circuit 810 through weak feedback inverter loops (WILs). The clock generating circuit 810 also includes an enable input signal shift_enable, which enables the circuit when it is low and disables the circuit when it is high. As shown in FIG. 26, the shift_enable signal is the NAND of the in_go signal (from the reload sequencer circuit 150) and an inverted version of the global synchronization signal main_clk.

The shift sequencer circuit generates shift_done and shift_ack signals. The shift_done signal is simply the output f5 of latch F5, through a WIL, which indicates that shifting is completed. The shift_ack signal is the NAND of the outputs f2, f4, and f5, which is coupled to the adder circuit 500 and acknowledges the application of the shift16, shift8, or shift0 signals.

The operation of the shift sequencer circuit 800 is illustrated in Table 6, which shows the sequence of the output signals f0–f5 and in_clk resulting from a reset. As shown in Table 6, the "0" produced by the reset in latch F0 propagates sequentially through the latches. The propagation of the "0" causes in_clk to alternate between low and high. As shown in the last two states, the output f5 maintains a "0" until the main_clk signal becomes high.

TABLE 6

Shift Sequencer Logic Example

| in_go | main_clk | f0 | f1 | f2 | f3 | f4 | f5 | in_clk |
|---|---|---|---|---|---|---|---|---|
| 1 | 0 | 0 | 1 | 1 | 1 | 1 | 1 | 1 |
| 1 | 0 | 0 | 0 | 1 | 1 | 1 | 1 | 0 |
| 1 | 0 | 1 | 0 | 0 | 1 | 1 | 1 | 1 |
| 1 | 0 | 1 | 1 | 0 | 0 | 1 | 1 | 0 |
| 1 | 0 | 1 | 1 | 1 | 0 | 0 | 1 | 1 |
| 1 | 0 | 1 | 1 | 1 | 1 | 0 | 0 | 0 |
| 1 | 0 | 1 | 1 | 1 | 1 | 1 | 0 | 0 |
| 1 | 1 | 1 | 1 | 1 | 1 | 1 | 1 | 0 |

Figure 28:
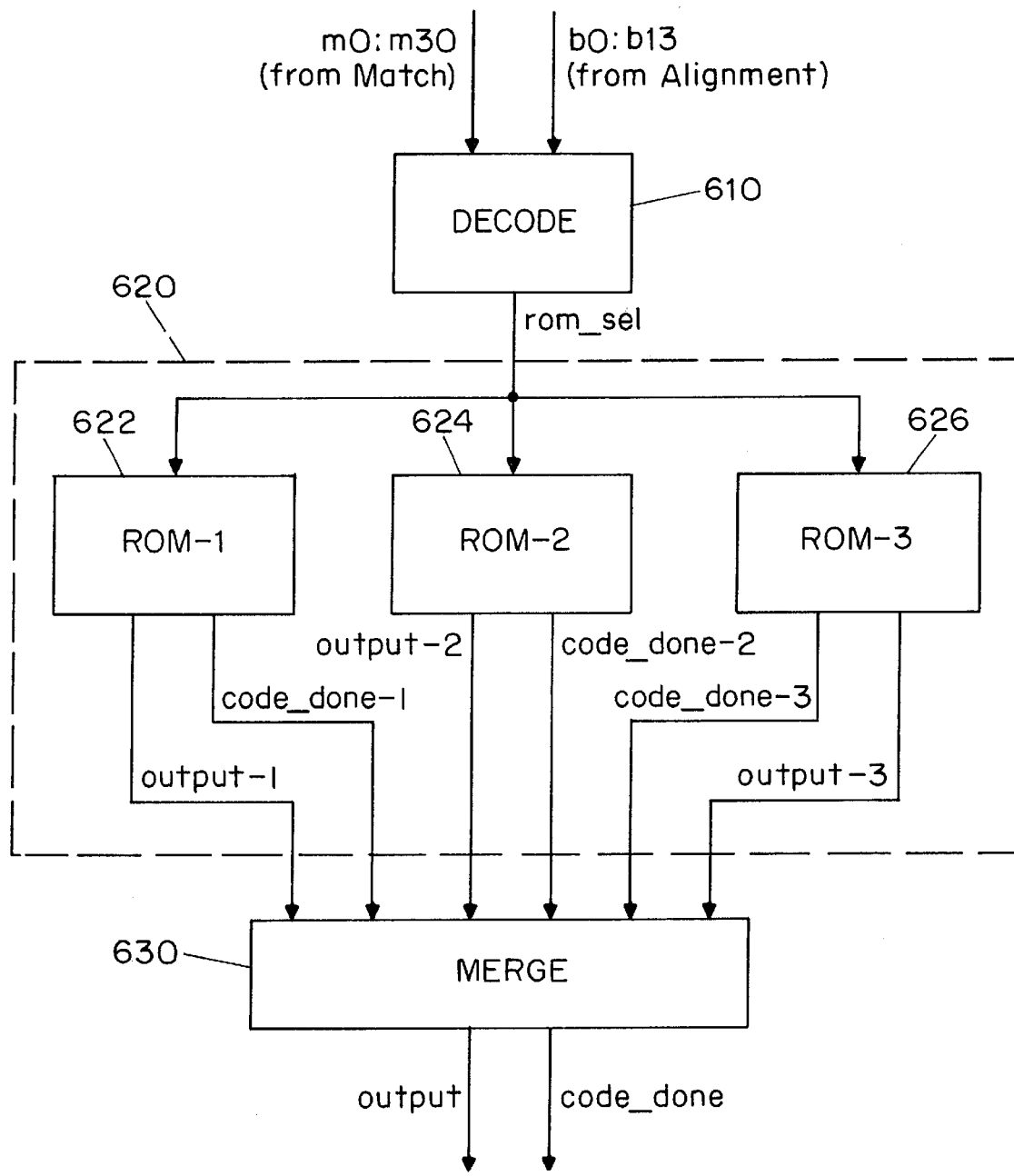
FIG. 28 is a functional block diagram of a preferred embodiment of a symbol decode circuit of a decoder according to the embodiment of FIG. 1B.

FIG. 28 shows a functional block diagram of a preferred embodiment of symbol decode circuit 600. As shown in FIG. 28, the symbol decode circuit 600 is divided into three stages: a decode logic stage 610, a ROM stage 620, and a merge stage 630.

The decode logic stage 610 receives the m0:m30 signals from the match logic circuit 300 and the b0:b13 signals from the alignment circuit 200. It produces a plurality of rom_sel signals, one for each word line in the ROM stage 620. For example, for an eight-bit output symbol, the ROM stage will have 256 word lines (one word line for each possible combination of the eight-bit output symbol). Therefore, the decode logic stage 610 will generate 256 rom_sel signals.

The ROM stage 620 includes one or more ROMs, which collectively contain a word line for each possible output symbol. In the case of an eight-bit output symbol, the ROM stage includes 256 word lines. Although a single ROM may be used, multiple ROMs are preferably used to increase the performance of the circuit. For example, FIG. 28 shows three ROMs 622, 624, and 626, each having 86 word lines. (The last ROM 626 has two spare word lines.)

Each ROM in the ROM stage 620 contains one bit line for each bit in the output symbol and an extra bit line for use as a completion signal. For example, in an eight-bit output symbol, each ROM contains nine bit lines. The implementation of each ROM is similar to that of the length decode ROM 400—i.e., the word lines and bit lines are arranged cross-wise in an array, with the output symbols associated with each word line coded therein. The extra bit line is enabled by every input and acts as a matched delay for the ROM. When multiple ROMs are used, the corresponding bits of the outputs of each ROM in the ROM stage 620 are merged in the merge stage 630.

Referring back to Table 2, it is apparent that a separate decoder may be used to decode the m0:m30 and b0:b13 signals for each class. It should be noted, however, that multiple classes use the same enumerating bits. Thus, it is more efficient to combine some of the decoding logic for certain classes. For example, class 4 needs a decoder that decodes bits b4, b5, and b6, and class 5 needs a decoder that decodes bits b5 and b6. If each decoder is implemented as a tree of 1:2 decoders, then a b5–b6 decoder is part of a b4–b5–b6 decoder.

Figure 29:
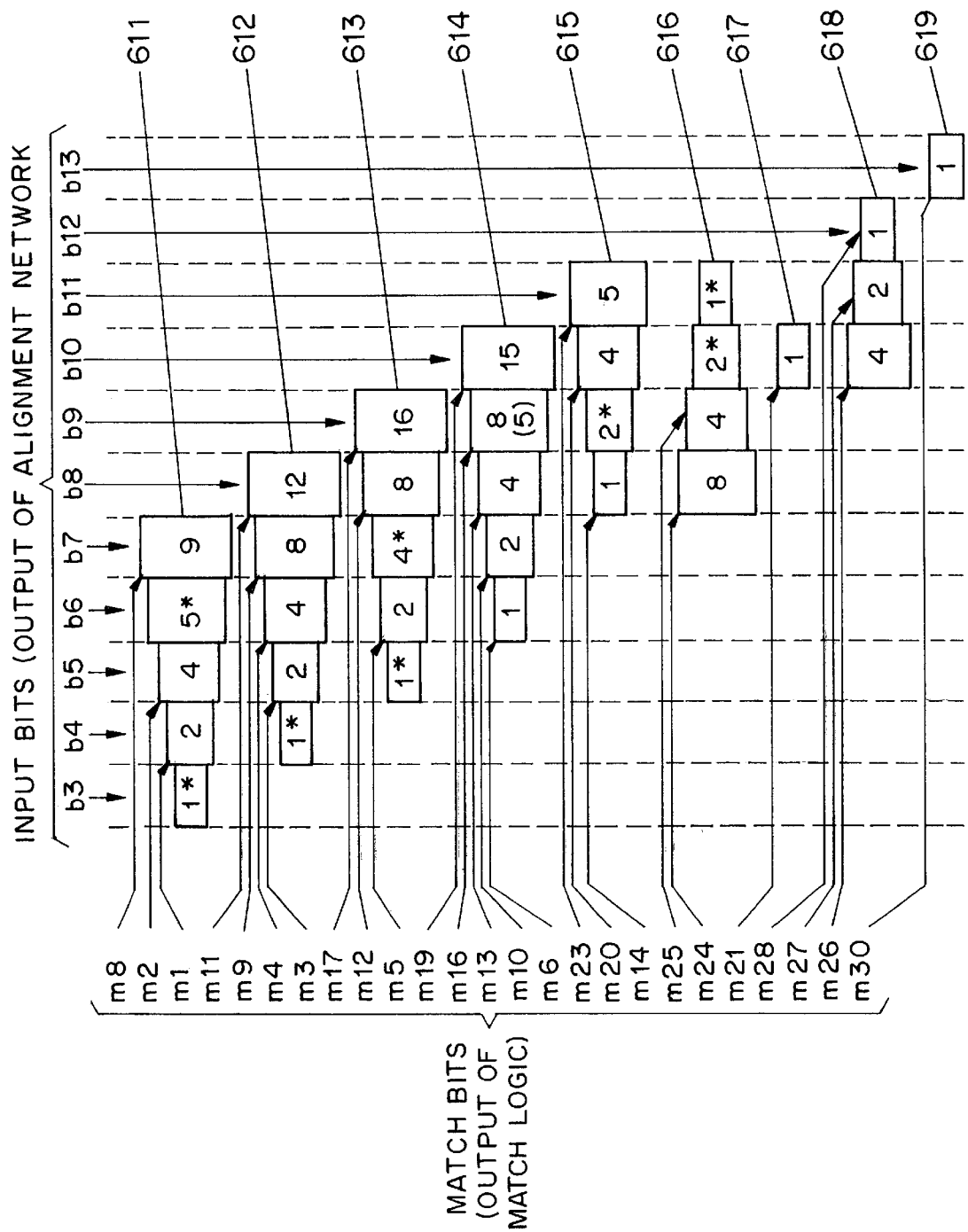
FIG. 29 is a functional block diagram of a preferred embodiment of a decode logic stage of a symbol decode circuit according to the embodiment of FIG. 28.

FIG. 29 shows a block diagram of a preferred embodiment of the decode logic stage 610, in which the logic has been arranged as nine decoder groups 611 to 619. Each group contains one or more decoder levels, as represented by the boxes in each group. Each number in a decoder box represents the number of 1:2 decoders in that box. Each group decodes from the smallest decoder box to the largest decoder box.

All of the decoders in FIG. 29 produce ROM select lines except for the decoders in decoder boxes containing an asterisk. A special case is the decoder box receiving the m16 input in group 614, in which only five of the eight decoders in the decoder box produce ROM select lines. It should also be noted that the match outputs m0, m7, m15, m18, m22, and m29 are not used as inputs to any of the decoders in FIG. 29. These outputs are used directly as ROM select lines because the classes represented by these outputs each have only one member. Preferably, the decoding of the enumerating bits from the alignment circuit 200 is performed in parallel with the decoding process of the match logic circuit 300. Then, the outputs of the match stage 300 are used simply as enable signals to the decoders of FIG. 29.

Figure 30:
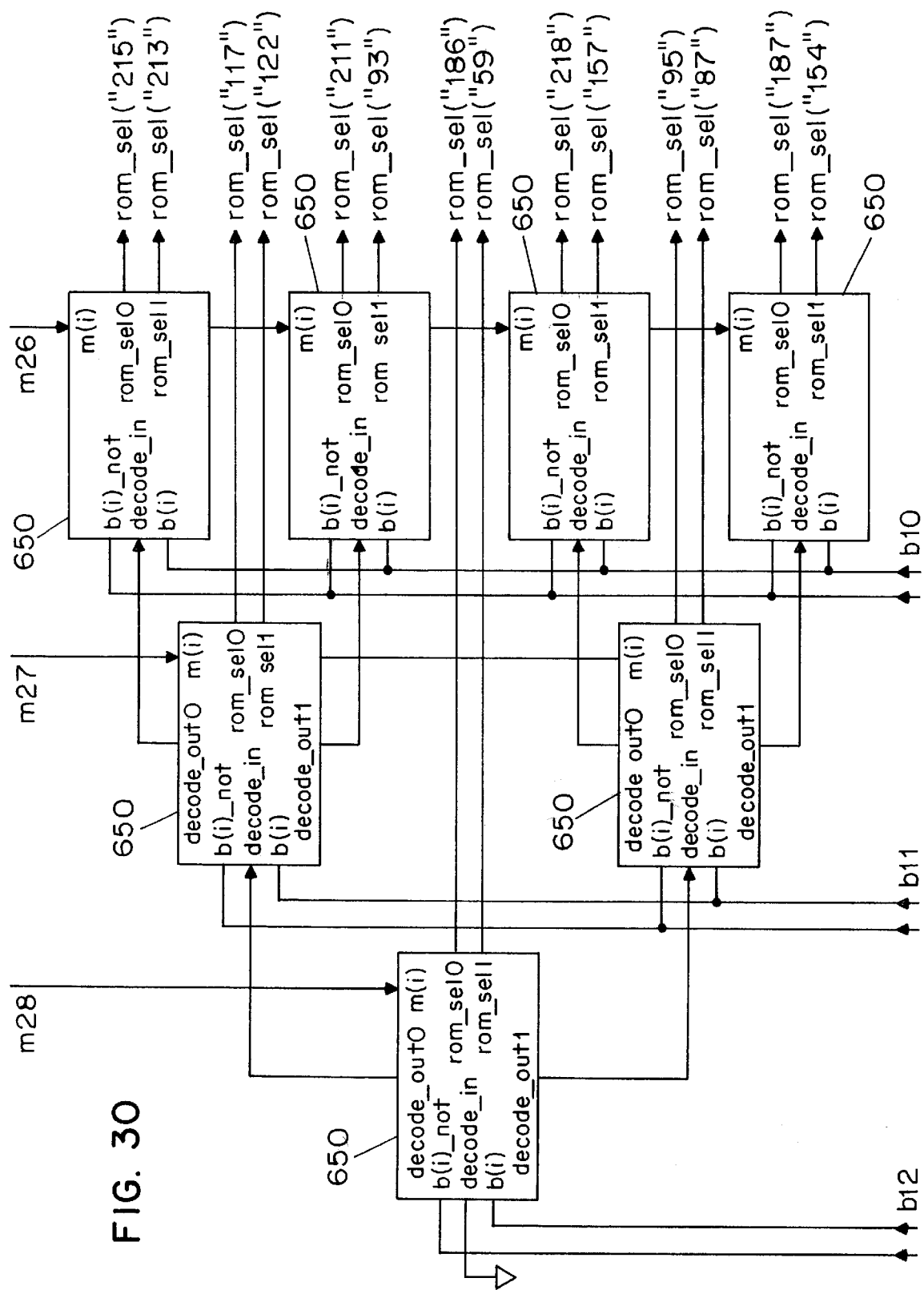
FIG. 30 is a partial block diagram of a decoder group of the decode logic stage of FIG. 29.

FIG. 30 shows a detailed functional block diagram of the decoder group 618 of FIG. 29. Group 618 contains three levels of decoders, the first level containing one decoder 650, the second level containing two decoders 650, and the third level containing four decoders 650. Each decoder has a pair of decode_out signal outputs and a pair of rom_sel signal outputs. The decode_out signal outputs are coupled to decoders in the next level and the rom_sel signal outputs are coupled to the ROM stage 620.

Figure 31:
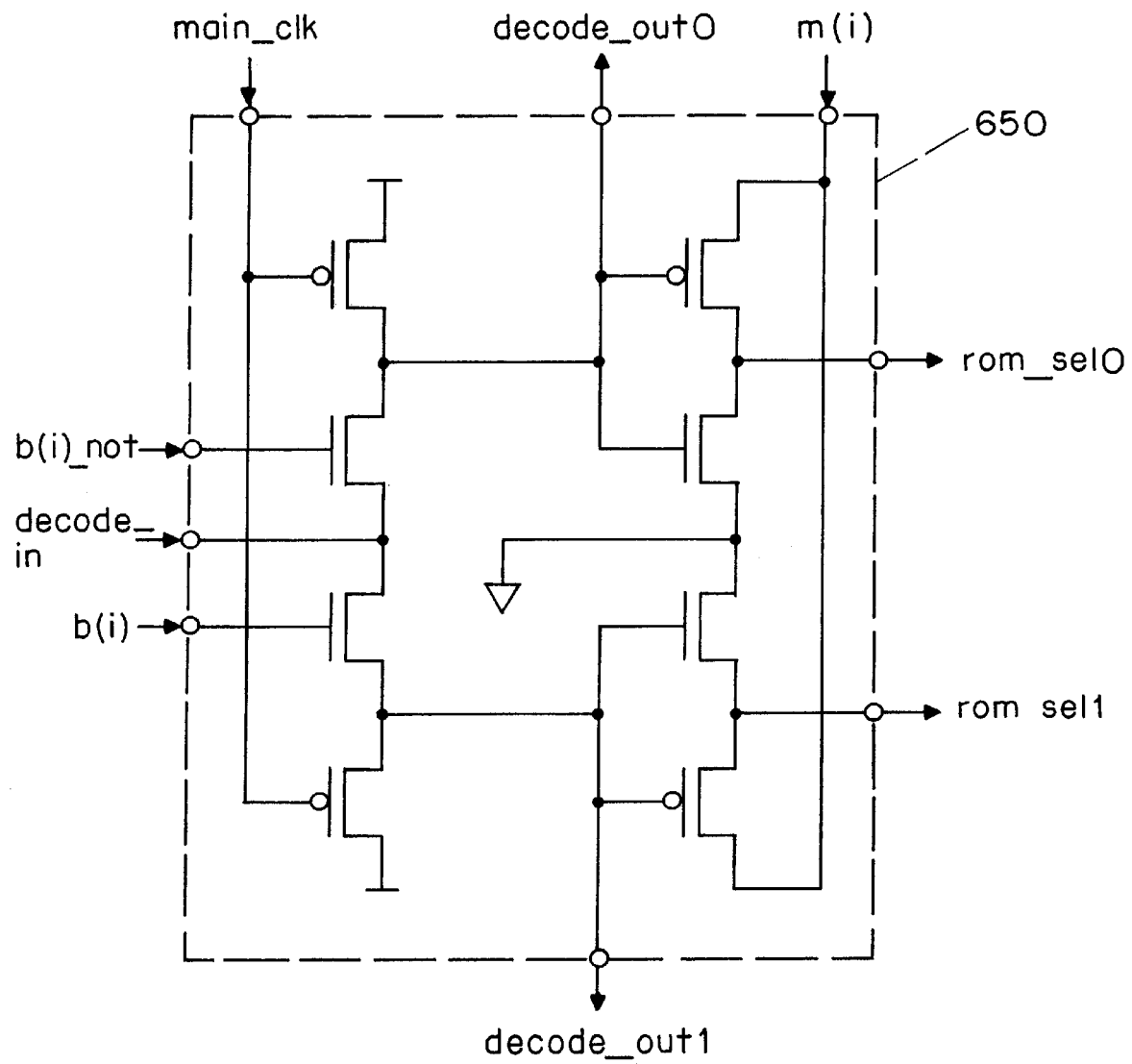
FIG. 31 is a schematic diagram of a preferred embodiment of a decoder of a symbol decode circuit according to the embodiment of FIG. 30.

FIG. 31 shows a schematic diagram of a preferred embodiment of the decoder 650. The global synchronization signal main_clk acts as a precharge input for the decoder 650. The decoder 650 has two stages, each with a pair of outputs and an enable input signal. The first stage has outputs decode_out0 and decode_out1, which are enabled by enable input decode_in, and the second stage has outputs rom_sel0 and rom_sel1, which are enabled by m(i).

When decode_in is low and main_clk is high, the first stage of the decoder 650 is enabled and the dual-rail bit pair b(i)/b(i)_not select one of the outputs decode_out0 and decode_out1 to be driven low. When decode_in is low and m(i) is high, the second stage of the decoder 650 is enabled and one of the outputs rom_sel0 and rom_sel1 is driven high depending on the value of the bit pair b(i)/b(i)_not.

Figure 32A:
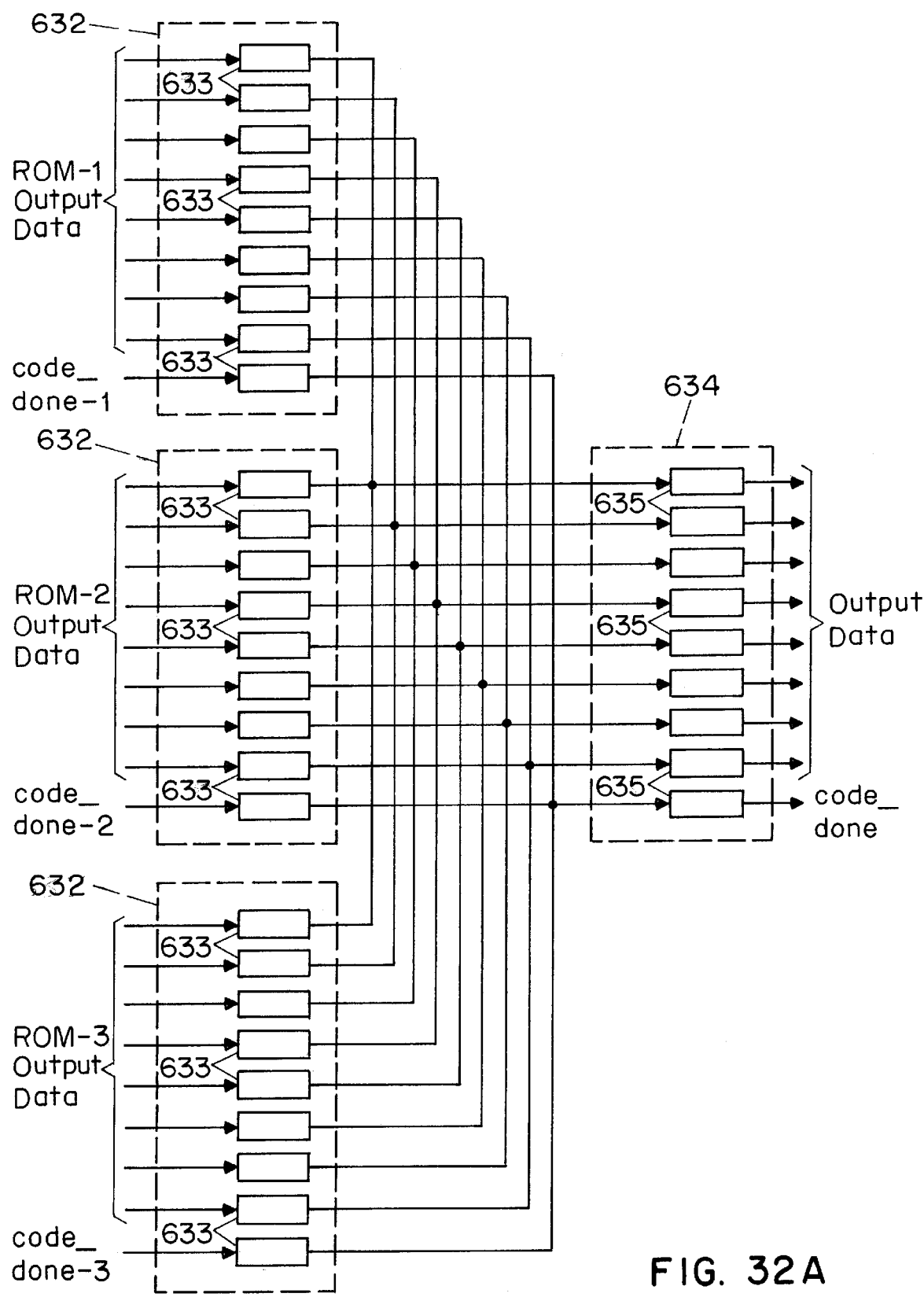
FIG. 32A is a preferred embodiment of a merge circuit of a decoder according to the embodiment of FIG. 1B.

FIG. 32A is a functional block diagram of a preferred embodiment of the merge stage 630. As shown in FIG. 32A, the data outputs and completion signal from each of the ROMs is buffered by a bank 632 of buffers 633. The corresponding outputs of the buffers 633 are wire-ORed together and are further buffered by a bank 634 of buffers 635.

Figure 32B:
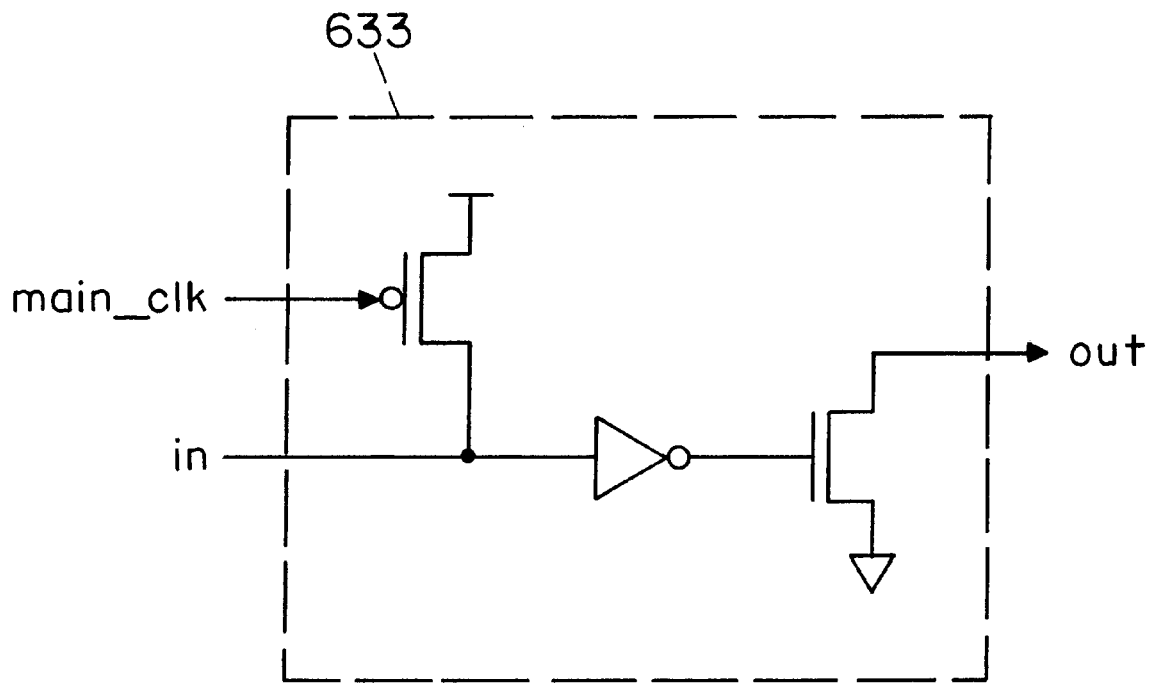
FIG. 32B is a preferred embodiment of a buffer of the merge circuit of FIG. 32A.
Figure 32C:
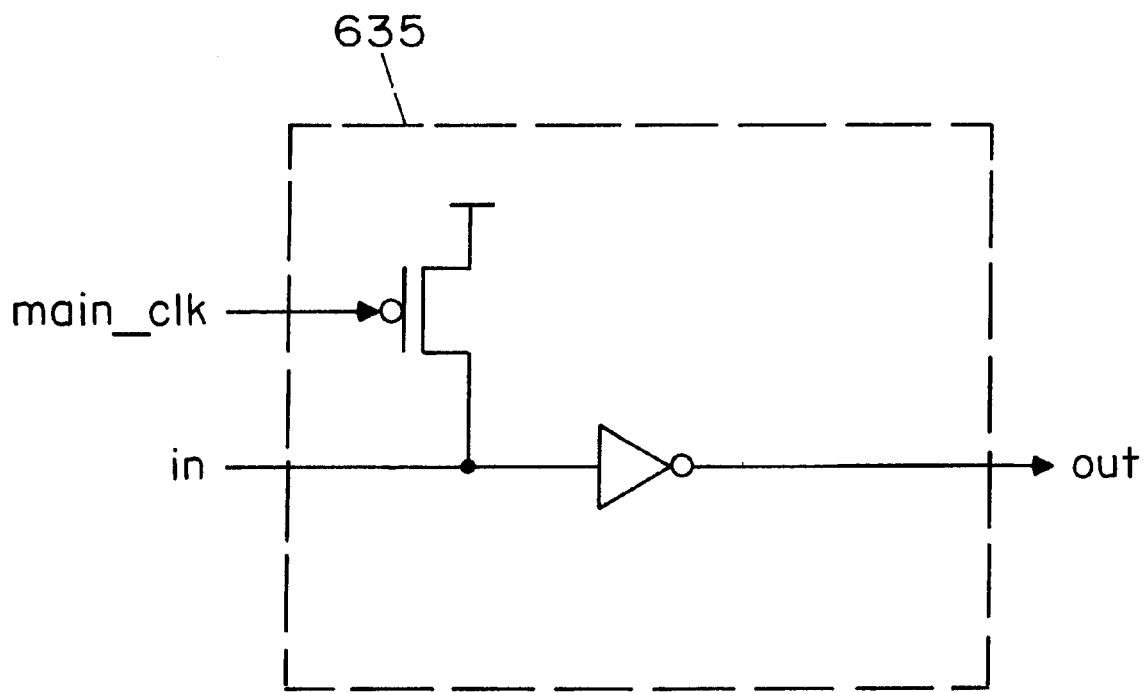
FIG. 32C is a preferred embodiment of a buffer of the merge circuit of FIG. 32A.

FIG. 32B is a schematic diagram of a preferred embodiment of buffer 633. The input (in) is precharged high when main_clk is low. The output (out) is pulled low when the input is low. FIG. 32C is a schematic diagram of a preferred embodiment of buffer 635. The buffer 635 shown in FIG. 32C is simply an inverter with the input precharged high when main_clk is low.

Preferably, for increased performance, the merge circuitry associated with the completion signals from the ROMs (which, when merged, produce the code_done signal) has an extra pull-down transistor on the output D, the input of which is coupled to the m0 output of the match logic circuit. Thus, the code_done signal will be driven high when m0 is high. The extra transistor is preferred because the m0 output corresponds to the zero symbol. Since the output of the ROMs and the merge stage are already zero during precharging, there is no need to perform any further computations when m0 is asserted.

Figure 33:
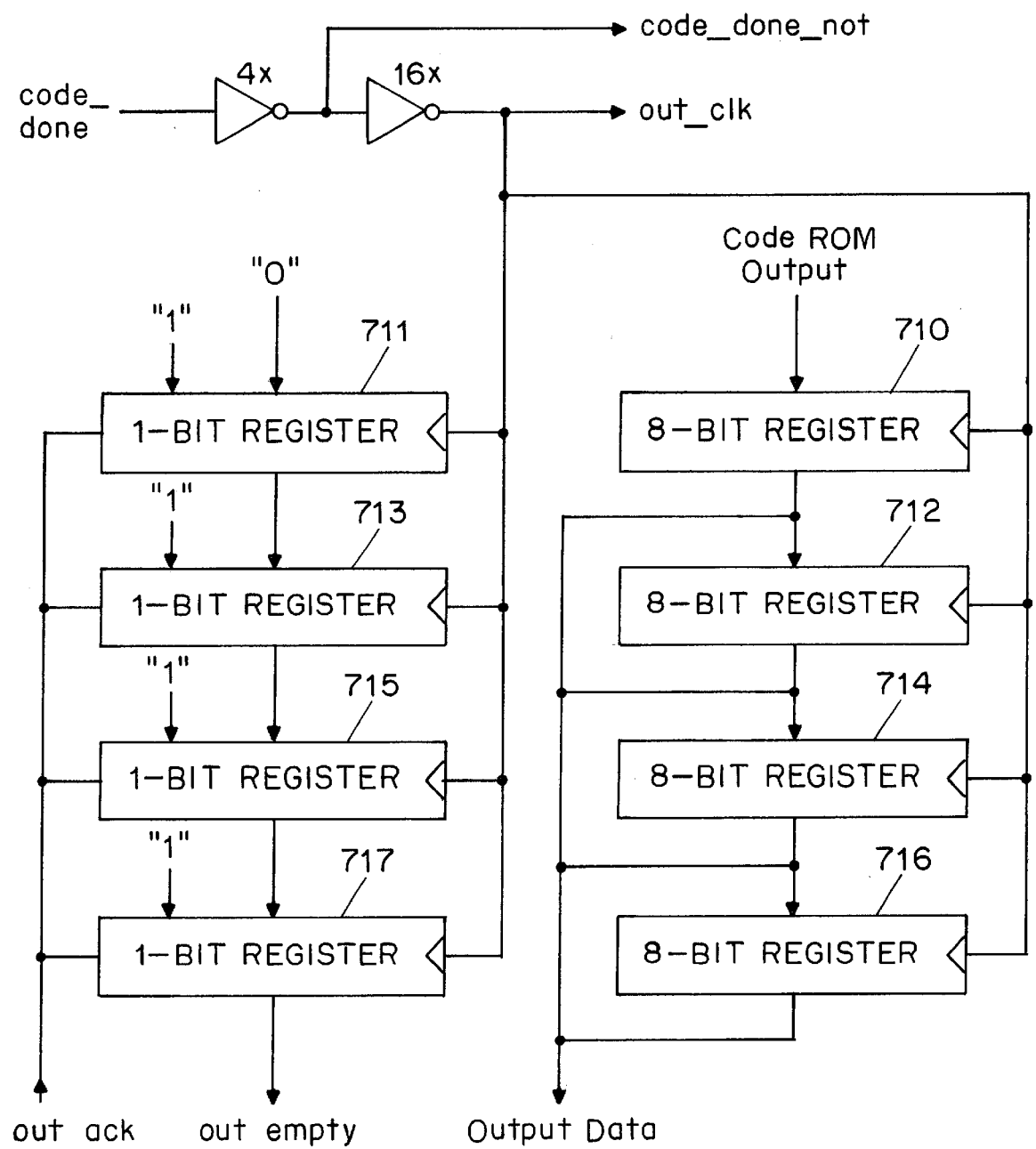
FIG. 33 is a preferred embodiment of an output buffer of a decoder according to a the embodiment of FIG. 1B.

FIG. 33 shows a functional block diagram of a preferred embodiment of the output buffer 700. The output buffer contains four 8-bit registers 710, 712, 714, and 716 connected in series. The output data from the merge stage 630 is clocked into register 710 by the signal out_clk, which is a buffered version of code_done. The output data is then shifted sequentially through registers 712, 714, and 716 on subsequent cycles of out_clk. When four bytes are ready (i.e., all four registers 710, 712, 714, and 716 contain data), the bytes are transmitted together as a 32-bit word.

The output buffer 700 also has four one-bit status registers 711, 713, 715, and 717, which are also connected in series and clocked by out_clk. The status registers are loaded with a "1" when the circuit receiving the output data acknowledges the receipt of the output data (i.e., when out_ack is asserted). Subsequently, as the status registers are clocked by out_clk, a "0" is shifted sequentially from the first register 711 to the last register 717. The output of the last register 717 is the signal out_empty, which when low indicates that the output buffer is ready to transmit a 32-bit word.

Figure 34:
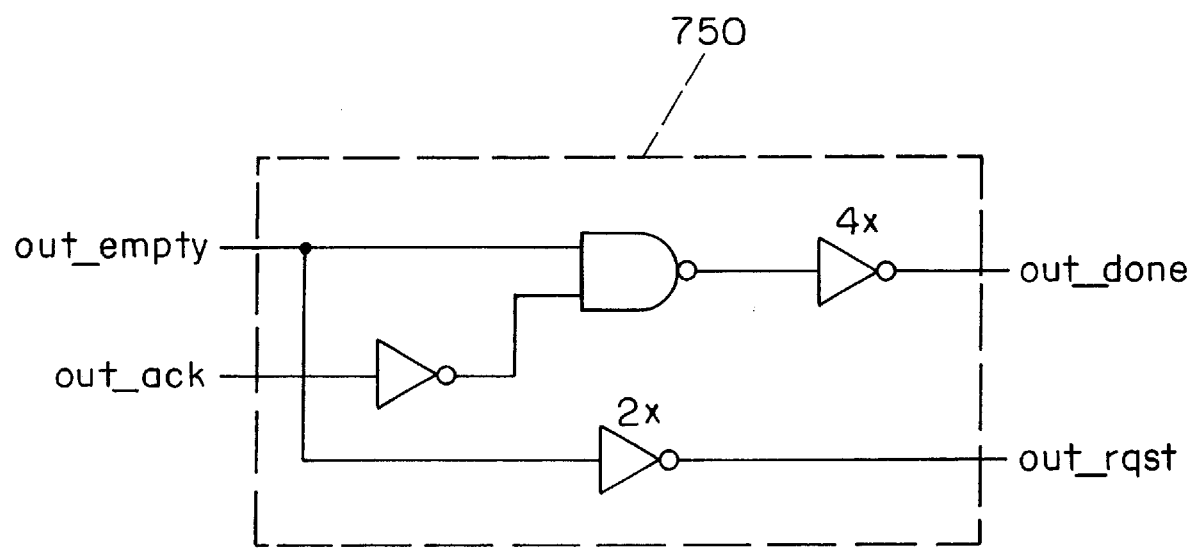
FIG. 34 is a functional block diagram of a preferred embodiment of an output handshake circuit of a decoder according to the embodiment of FIG. 1B.

FIG. 34 shows a schematic diagram of the handshaking circuit 750. As shown, the signal out_empty (from the output buffer 700) is inverted to produce the signal out_rqst, which indicates that output data is ready. In addition, the signal out_ack (from the circuit receiving the output data) is inverted and NANDed with the signal out_empty. The output of the NAND gate is inverted to produce the signal out_done, which indicates that the output asynchronous handshake is completed.

Figure 35:
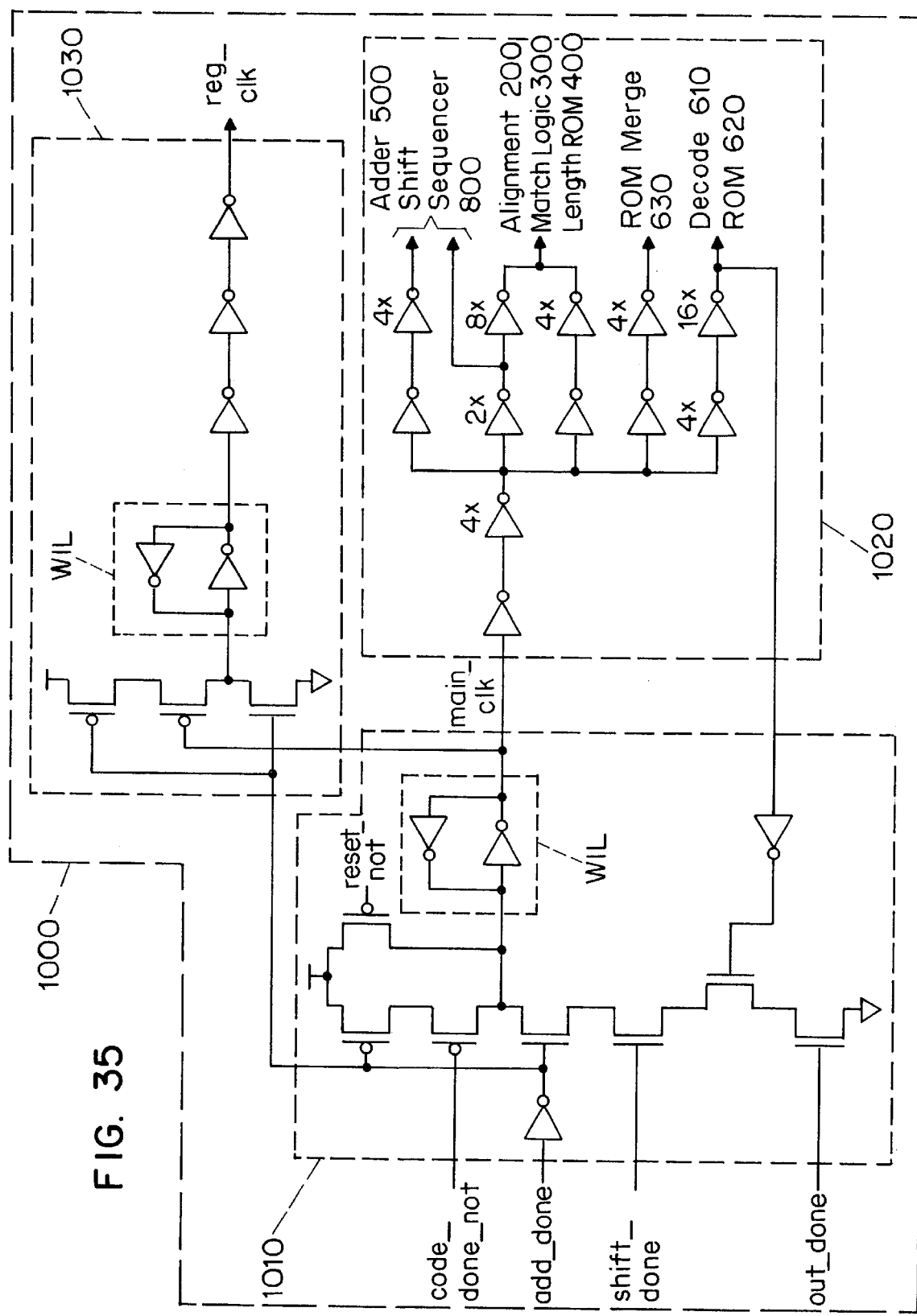
FIG. 35 is a functional block diagram of a preferred embodiment of a timing control circuit of a decoder according to the embodiment of FIG. 1B.

FIG. 35 shows a schematic diagram of a preferred embodiment of the timing control circuit 1000. The timing control circuit 1000 includes a main_clk generator circuit 1010, clock buffers 1020, and a reg_clk generator circuit 1030. The main_clk generator circuit 1010 generates the global synchronization signal main_clk through transistor circuitry having inputs reset_not, code_done_not, add_done, shift_done, and out_done. The transistor circuitry also receives an inverted version of main_clk as a feedback input. The logic of the transistor circuitry used to generate main_clk is shown in Table 7.

TABLE 7

Main_clk Generator Logic

| Input Signals | main_clk |
|---|---|
| reset_not = 0 | 0 |
| add_done AND $\overline{\text{code\_done\_not}}$ = 1 | 0 |
| out_done AND shift_done AND $\overline{\text{main\_clk}}$ AND add_done = 1 | 1 |

Since the main_clk signal is routed throughout the decoder, it should be properly buffered. The clock buffers 1020 provide this function. As shown in FIG. 35, the output of one of the buffers is used as a feedback input to the main_clk generator circuit 1010.

The reg_clk generator circuit 1030 generates a clock signal for the offset register 900. The logic for the reg_clk generator circuit 1030 is provided in Table 8. In Table 8, an "x" represents a "don't care."

TABLE 8

Reg_clk Generator Circuit Logic

| add_done | main_clk | reg_clk |
|---|---|---|
| 0 | x | 0 |
| 1 | 0 | 1 |
| 1 | 1 | reg_clk |

Figure 36:
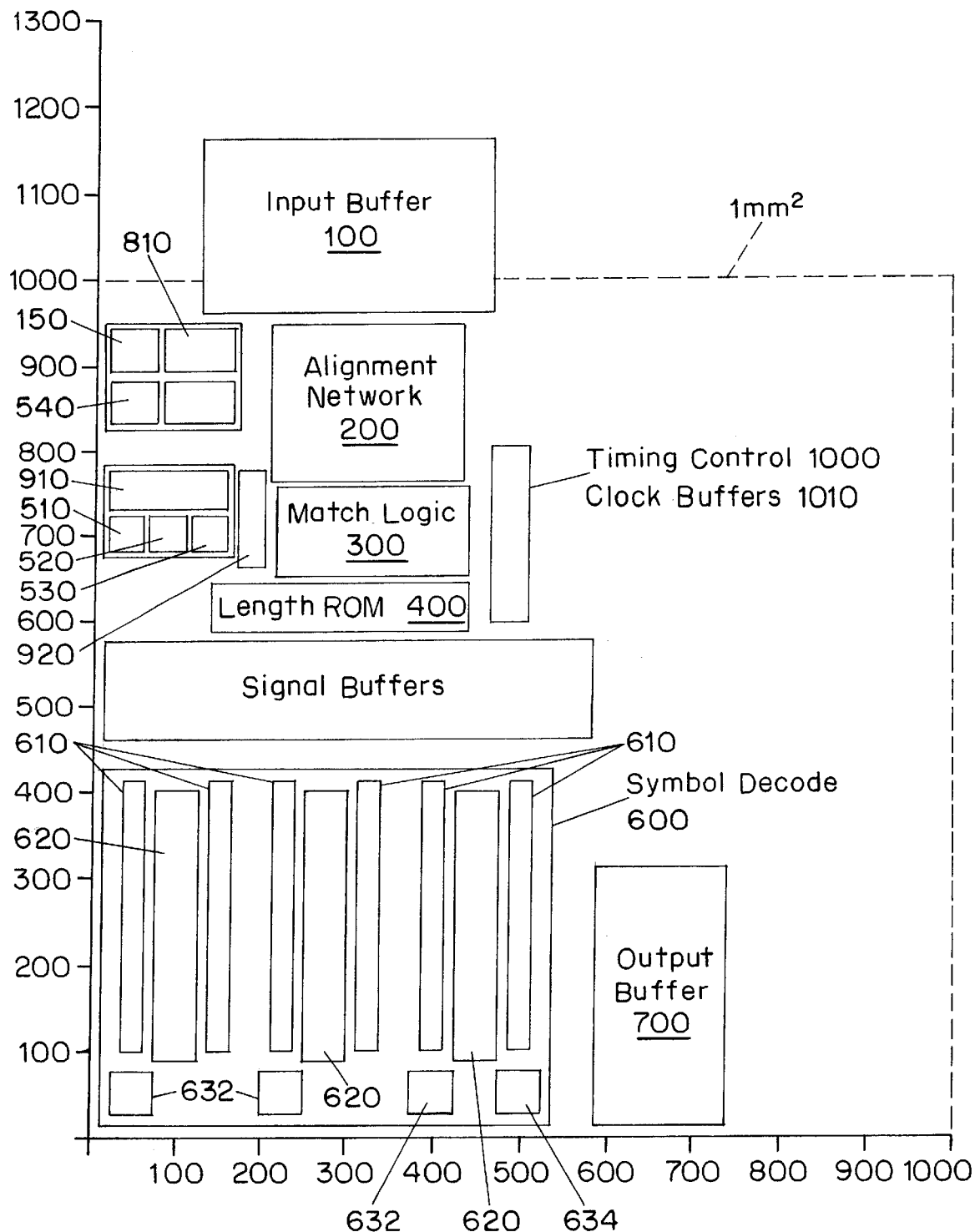
FIG. 36 is a prefer-red embodiment of a layout of a decoder according to the embodiment of FIG. 1B.

FIG. 36 shows a preferred embodiment of a semiconductor die layout of the decoder of the present invention. The area of the active circuitry is about 0.75 mm$^2$. The preferred layout may be used with a 65-pin PGA package. It is noted that, in the layout of the bit-0 adder 510, bit-1 adder 520, and bit-2 adder 530, a traditional standard-cell style is not preferred because these circuits contain many more n-FET transistors than p-FET transistors. In addition, it is noted that the widest transistors are used in the layout of the reload sequencer circuit 150, shift signal generator circuit 540, and shift sequencer circuit 800 (comprising clock generating circuit 810 and latches F0–F5) because these circuits comprise delicate asynchronous components and their failure is undesirable. Moreover, wider transistors help reduce the effect of process variation on gate delays.

Figure 37:
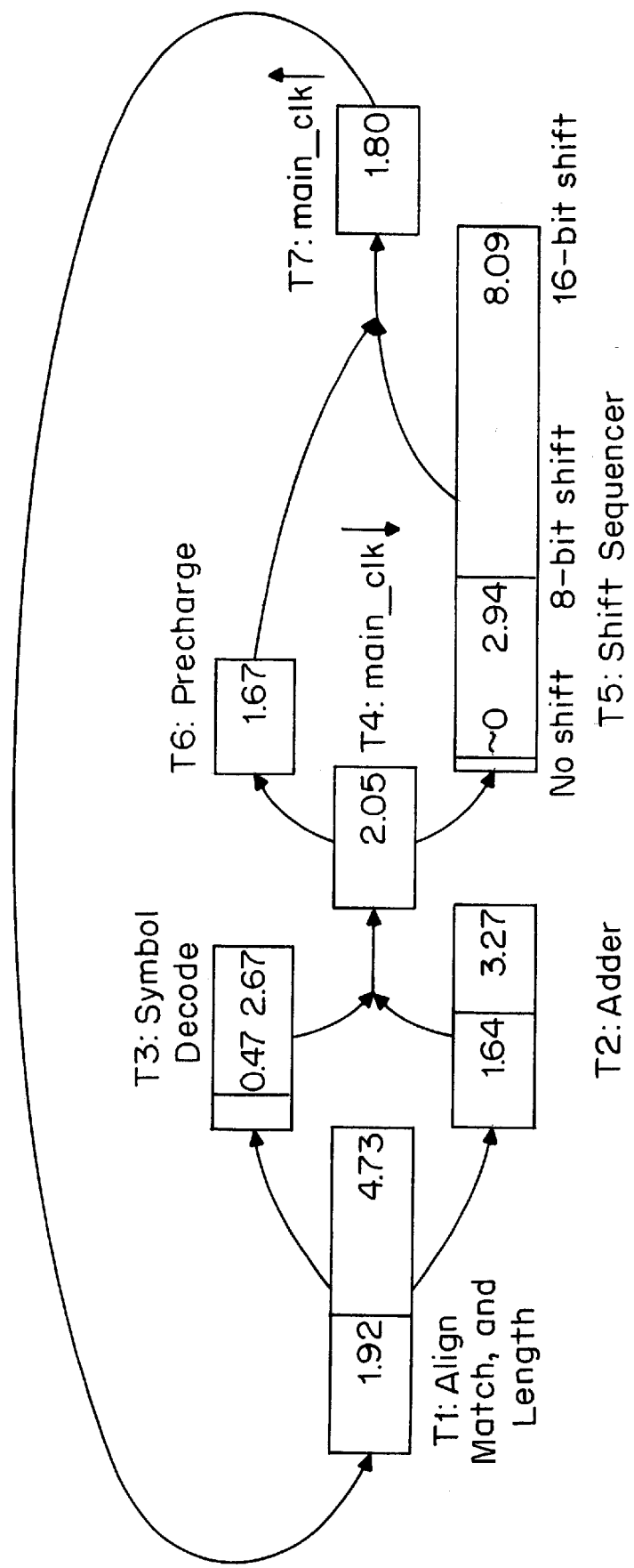
FIG. 37 is an exemplary timing diagram of a decoder according to the embodiment of FIG. 1B.

FIG. 37 is a timing diagram of a decode cycle produced by a simulation of a decoder according to the present invention. Block T1 corresponds to the timing of the alignment circuit 200, the match logic circuit 300, and the length ROM 400; block T2 corresponds to the timing of the adder circuit 500; block T3 corresponds to the timing of the symbol decode circuit 600; block T4 corresponds to the high-to-low transition timing of the main_clk signal; block T5 corresponds to the timing of the shift sequencer circuit 800; block T6 corresponds to the time to precharge the dynamic logic circuits of the decoder; and block T7 corresponds to the low-to-high transition timing of the main_clk signal. The first number in each block corresponds to the minimum processing time for the block, and the last number in each block corresponds to the maximum processing time for the block. For the purpose of the simulation, it is assumed that data is loaded into the input buffer 100 and read from the output buffer 700 fast enough so that these circuits are not bottlenecks. In addition, for the sake of simplicity, the times in block T3 are given relative to the completion of the length ROM in block T1. However, the symbol decode circuit 600, as explained above, starts its computation prior to the completion of the length ROM.

Through simulations, it has been determined that the average input processing rate for a decoder according to the preferred embodiment of the present invention is about 560 Mbits/sec. Therefore, after normalizing for voltage and process differences, the decoder according to the present invention is significantly smaller than existing synchronous decoders, yet has a higher throughput rate than most existing decoders.

Figure 38:
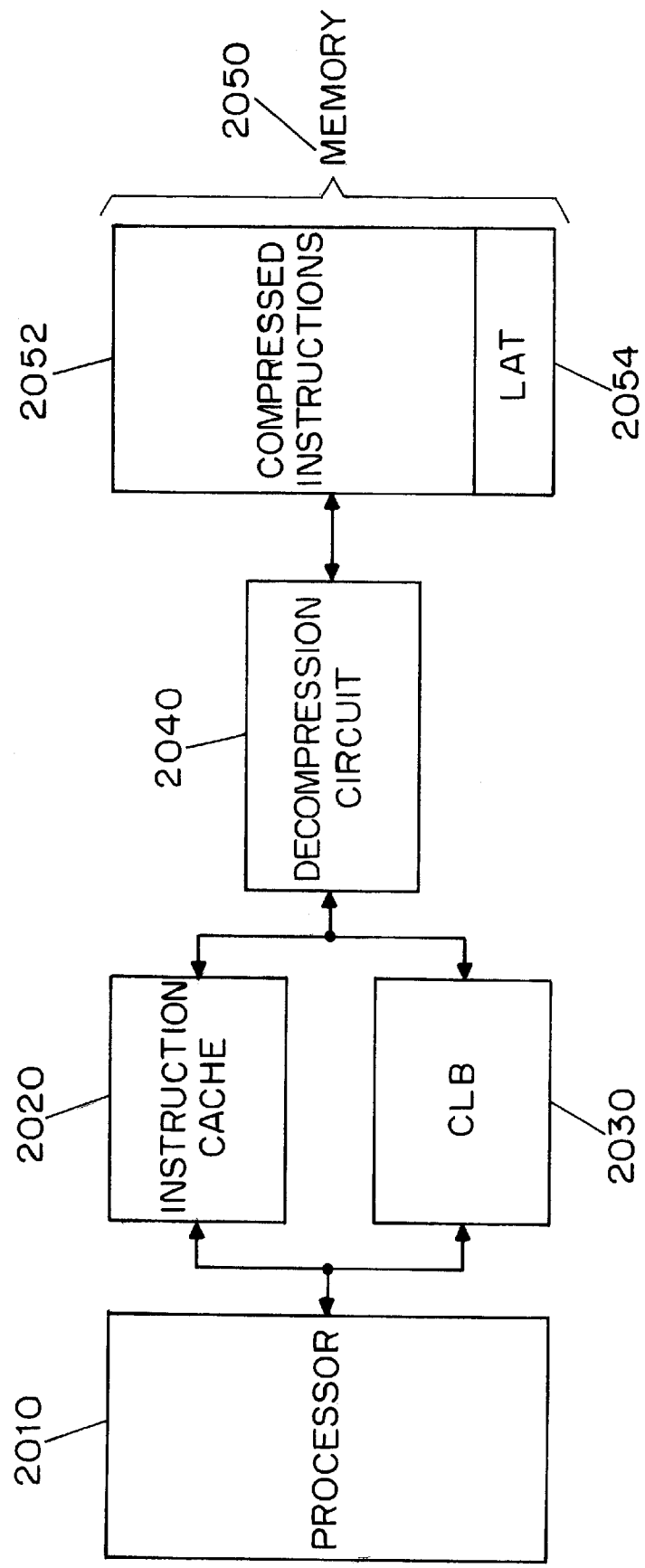
FIG. 38 is a block diagram of a compressed-code microprocessor system according to a preferred embodiment of the present invention.

As previously mentioned, a decoder according to the present invention may be used in compressed-code systems. FIG. 38 is a block diagram of a compressed-code system utilizing a decoder according to the present invention. The compressed-code system includes a processor 2010 coupled to an instruction cache 2020 and a cache look-aside buffer (CLB) 2030. The instruction cache 2020 and the CLB 2030 are coupled to a decoder 2040, which in turn is coupled to an instruction memory 2050. The instruction memory 2050 is divided into two portions, a compressed instruction memory portion 2052 and a line address table (LAT) 2054.

The LAT 2054 serves as a page table for the compressed instruction lines located in the compressed instruction memory portion 2052. The CLB 2030 serves to cache the most recently accessed LAT entries to speed up cache line refill. It has been reported that the overheads of the LAT and CLB are very small and that the compressed-code architecture allows a substantial reduction in the size of instruction memory. (See M. Kozuch and A. Wolfe, Compression of Embedded System Programs, IEEE International Conference on Computer Design, pp. 270–277, October 1994; and A. Wolfe and A. Chanin, Executing Compressed Programs on an Embedded RISC Processor, 25 th Annual International Symposium on Microarchitecture, pp. 81–91, December 1992.) Advantageously, the reduction in program size can translate into lower cost, weight and power consumption for the entire system. It can also allow the addition of extra program features without increasing the budget for memory size.

Although the present invention has been described with reference to certain preferred embodiments, various modifications, alterations, and substitutions will be known or obvious to those skilled in the art without departing from the spirit and scope of the invention, as defined by the appended claims.

We claim:

1. A decoder circuit comprising:
   a logic circuit for decoding variable-length coded data, which includes a plurality of computational logic stages, each of the computational logic stages having a synchronization signal input and a completion signal output, each completion signal output indicating the completion of the computation performed by a computational logic stage; and
   a timing circuit including a plurality of completion signal inputs and a synchronization signal output, the synchronization signal output being a predetermined function of the completion signal inputs, the completion signal inputs being coupled to the completion signal outputs of the computational logic stages, and the synchronization output being coupled to the synchronization signal inputs of the computational logic stages.

2. The decoder circuit of claim 1, wherein the logic circuit further comprises:
   an alignment circuit for shifting an input data word by an amount responsive to a control input and for outputting the shifted data word;
   a match logic circuit coupled to the output of the alignment circuit for decoding the class of a coded data word included in the shifted data word, the coded data word being coded according to a variable-length coding technique in which coded data words may be classified according to their word length and the occurrence of common bits therein, the common bits being unique relative to at least a subset of the classes of the coded data words;
   a decode logic circuit coupled to the output of the alignment circuit for decoding the coded data word included in the shifted data word;
   a length logic circuit coupled to the output of the match logic circuit for determining the length of the coded data word included in the shifted data word;
   an offset register having a register data input and a register data output, the register data output coupled to the control input of the alignment circuit; and
   an adder circuit for adding first and second adder inputs, the first adder input coupled to the output of the length logic circuit and the second adder input coupled to the register data output, the output of the adder circuit coupled to the register data input.

3. The decoder circuit of claim 2, wherein the alignment circuit, the match logic circuit, and the adder circuit comprise a computational logic stage.

4. The decoder circuit of claim 2, wherein the alignment circuit, the match logic circuit, and the decode logic circuit comprise a computational logic stage.

5. The decoder circuit of claim 2, wherein the adder circuit further comprises a carry output indicative of a carry resulting from the addition of the first and second adder inputs; and wherein the logic circuit further comprises:
   an input buffer having a plurality of registers, each of the registers having a data input, a data output, and a clock input for latching the data input onto the data output, the registers coupled together in series, the data output of one or more of the registers coupled to the data input of the alignment circuit; and
   a shift sequence circuit coupled to the carry output of the adder circuit and to the clock inputs of the plurality of registers for shifting the plurality of registers responsive to the carry output of the adder circuit.

6. The decoder circuit of claim 5, wherein the input buffer further includes means for indicating the input buffer is full; and wherein one or more registers further include a second data input and a second clock input for latching the second data input onto the data output of the register; and wherein the logic circuit further comprises an input handshaking circuit for managing an asynchronous handshake between a request input and an acknowledge output, the input handshaking circuit responsive to the request input and the means for indicating the input buffer is full for controlling the second clock input and the acknowledge output.

7. The decoder circuit of claim 2, wherein the logic circuit further comprises:
   an output buffer coupled to the output of the decode logic circuit and having means for indicating the output buffer is empty; and an output handshake circuit coupled to the output buffer for managing an asynchronous handshake between a request output and an acknowledge input, the output handshaking circuit responsive to the request output and the means for indicating the output buffer is empty for controlling the request output.

8. The decoder circuit of claim 2, wherein the alignment circuit is a barrel shifter.

9. The decoder circuit of claim 2, wherein the match logic circuit comprises a plurality of decoders arranged in a tree structure.

10. The decoder circuit of claim 2, wherein the adder circuit is a ripple-carry adder.

11. The decoder circuit of claim 5, wherein the shift sequencer circuit comprises a plurality of latches coupled in series, the plurality of latches alternating between latches having positive edge-triggered clock inputs and latches having negative edge-triggered clock inputs.

12. A decoder system comprising:
a first circuit for providing variable-length coded data;
a decoder circuit coupled asynchronously to the first circuit, comprising:
a logic circuit for decoding the variable-length coded data provided by the first circuit, the logic circuit including a plurality of computational logic stages, each of the computational logic stages having a synchronization signal input and a completion signal output, each completion signal output indicating the completion of the computation performed by a computational logic stage; and
a timing circuit including a plurality of completion signal inputs and a synchronization signal output, the synchronization signal output being a predetermined function of the completion signal inputs, the completion signal inputs being coupled to the completion signal outputs of the computational logic stages, and the synchronization output being coupled to the synchronization signal inputs of the computational logic stages; and
a second circuit for receiving the decoded data coupled asynchronously to the decoder circuit.

13. A compressed code microprocessor system comprising:
a microprocessor;
a memory having stored therein program instructions that have been compressed using a variable-length coding technique and for, when uncompressed, being executable on the microprocessor; and
a decoder circuit coupled asynchronously to the microprocessor and the memory, the decoder circuit comprising:
a logic circuit for decompressing the program instructions in the memory, which includes a plurality of computational logic stages, each of the computational logic stages having a synchronization signal input and a completion signal output, each completion signal output indicating the completion of the computation performed by a computational logic stage; and
a timing circuit including a plurality of completion signal inputs and a synchronization signal output, the synchronization signal output being a predetermined function of the completion signal inputs, the completion signal inputs being coupled to the completion signal outputs of the computational logic stages, and the synchronization output being coupled to the synchronization signal inputs of the computational logic stages.

* * * * *

UNITED STATES PATENT AND TRADEMARK OFFICE
CERTIFICATE OF CORRECTION

PATENT NO. : 6,408,421 B1
DATED : June 18, 2002
INVENTOR(S) : Beneš et al.

It is certified that error appears in the above-identified patent and that said Letters Patent is hereby corrected as shown below:

Column 1,
Line 51, "a" should be deleted

Column 5,
Line 4, "prefer-red" should read -- preferred --

Column 8,
Table 1,
First column, "co" should read -- eo --;
Second column, "ac" should read -- ae -- and "1100111" should read -- 11000111 --;
Third column, "110111001" should read -- 110111011 -- and "1110011010" should read -- 111001010 --;
Fourth column, "ca" should read -- ea --; and
Fifth column, "ec" should read -- ee --

Column 11,
Lines 50 and 51, "$in_{13}$ rqst+" should read -- in__rqst+ --

Column 12,
Line 22, "seln/seln__-not" should read -- seln/seln__not --

Column 13,
Line 4, "(i.e.,n0" should read -- (i.e., n0 --
Line 19, "b(i) not" should read -- b(i)__not --
Line 35, "m)" should read -- m0 --

Column 14,
Line 20, "1001" should read -- 1001 -- (no bold)
Line 50, "bit0-done" should read -- bit0__done --

Column 15,
Line 65, "inputsG2/G2 not" should read -- inputs G2/G2__not --

Column 18,
Line 67, "rom__sell," should read -- rom__sel1, --

UNITED STATES PATENT AND TRADEMARK OFFICE
CERTIFICATE OF CORRECTION

PATENT NO.   : 6,408,421 B1
DATED        : June 18, 2002
INVENTOR(S)  : Beneš et al.

It is certified that error appears in the above-identified patent and that said Letters Patent is hereby corrected as shown below:

<u>Column 19,</u>
Line 6, "rom__sell," should read -- rom__sel1, --

<u>Column 20,</u>
Table 7, delete underscores

Signed and Sealed this

Twenty-eighth Day of January, 2003

JAMES E. ROGAN
*Director of the United States Patent and Trademark Office*